United States Patent
Pellizzer et al.

(10) Patent No.: US 9,443,562 B2
(45) Date of Patent: Sep. 13, 2016

(54) CONNECTIONS FOR MEMORY ELECTRODE LINES

(71) Applicant: Micron Technology, Inc., Boise, ID (US)

(72) Inventors: Fabio Pellizzer, Cornate D'Adda (IT); Everardo Torres Flores, Folsom, CA (US); Hernan A. Castro, Shingle Springs, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 14/982,362

(22) Filed: Dec. 29, 2015

(65) Prior Publication Data

US 2016/0133300 A1    May 12, 2016

Related U.S. Application Data

(62) Division of application No. 13/777,811, filed on Feb. 26, 2013, now Pat. No. 9,224,635.

(51) Int. Cl.
| | |
|---|---|
| *G11C 11/00* | (2006.01) |
| *G11C 5/06* | (2006.01) |
| *H01L 27/02* | (2006.01) |
| *H01L 23/528* | (2006.01) |
| *G11C 13/00* | (2006.01) |

(52) U.S. Cl.
CPC ........... *G11C 5/063* (2013.01); *G11C 13/0028* (2013.01); *H01L 23/528* (2013.01); *H01L 27/0207* (2013.01)

(58) Field of Classification Search
CPC .................................................... G11C 11/00
USPC ........... 365/46, 94, 100, 113, 129, 148, 158, 365/163; 256/2–5, 9, 296, 310, E21.35, 256/E31.047, E27.006; 438/29, 95, 96, 438/166, 135, 240, 259, 365, 482, 486, 597, 438/785
See application file for complete search history.

(56) References Cited

U.S. PATENT DOCUMENTS

| | | | |
|---|---|---|---|
| 4,231,108 A | 10/1980 | Suzuki et al. | |
| 4,419,745 A | 12/1983 | Toyoda et al. | |
| 5,959,920 A | 9/1999 | Kiyota | |
| 6,091,620 A | 7/2000 | Kablanian | |
| 6,654,274 B2 | 11/2003 | Kang et al. | |
| 6,816,404 B2 | 11/2004 | Khouri et al. | |
| 6,870,757 B2 | 3/2005 | Hidaka | |
| 7,453,150 B1 | 11/2008 | McDonald | |
| 8,575,590 B2 | 11/2013 | Muraoka et al. | |
| 8,598,579 B2 | 12/2013 | Chumakov et al. | |
| 8,891,280 B2 | 11/2014 | Castro et al. | |
| 9,025,398 B2 | 5/2015 | Flores et al. | |
| 9,190,144 B2 | 11/2015 | Castro et al. | |
| 2007/0253242 A1* | 11/2007 | Parkinson et al. | 365/163 |
| 2010/0110782 A1* | 5/2010 | Parkinson et al. | 365/163 |
| 2011/0019467 A1* | 1/2011 | Johnson et al. | 365/163 |
| 2011/0242885 A1 | 10/2011 | Kim | |
| 2011/0261616 A1 | 10/2011 | Kim | |

FOREIGN PATENT DOCUMENTS

EP    1237191 A2    9/2002

OTHER PUBLICATIONS

U.S. Appl. No. 14/637,158 entitled "Connections for Memory Electrode Lines"; filed Mar. 3, 2015, 47 pages.

\* cited by examiner

*Primary Examiner* — Harry W Byrne
(74) *Attorney, Agent, or Firm* — Holland & Hart LLP

(57) ABSTRACT

Subject matter disclosed herein may relate to word line electrodes and/or digit line electrodes in a cross-point array memory device. One or more word line electrodes may be configured to form a socket area to provide connection points to drivers and/or other circuitry that may be located within a footprint of an array of memory cells.

20 Claims, 15 Drawing Sheets

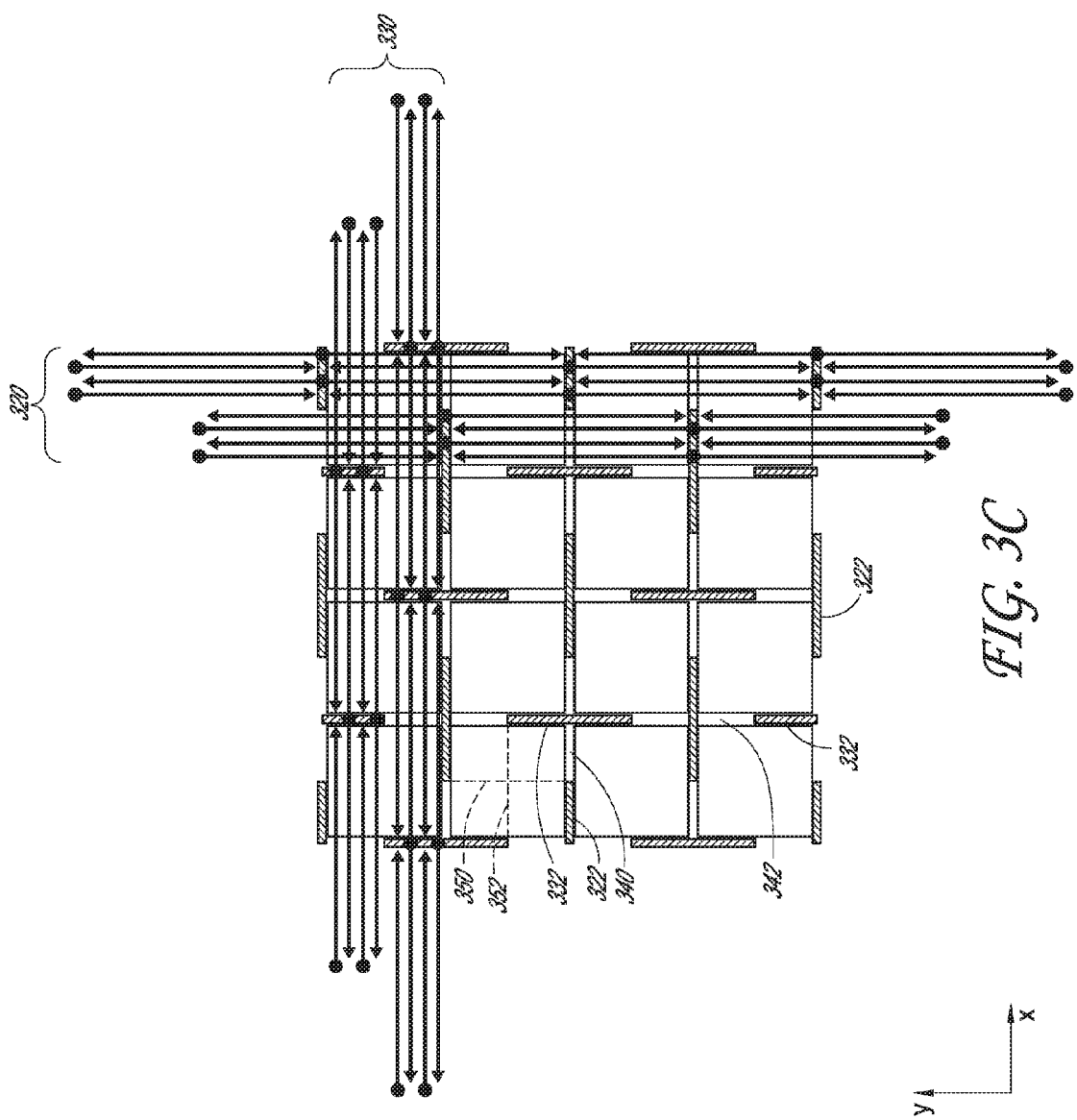

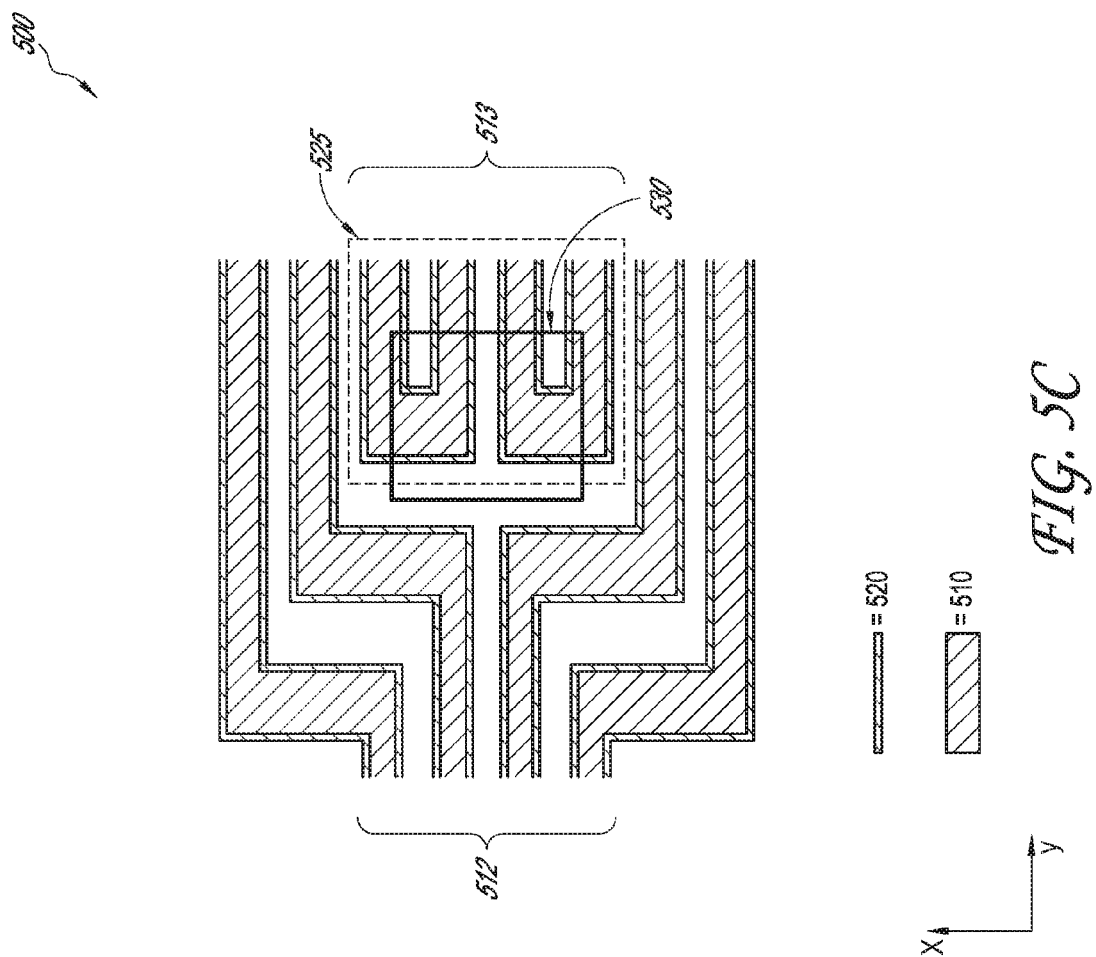

US 9,443,562 B2

CONNECTIONS FOR MEMORY ELECTRODE LINES

CROSS-REFERENCE TO RELATED APPLICATIONS

The present Application for Patent claims priority to and is a divisional application of U.S. patent application Ser. No. 13/777,811 by Pellizzer et al., entitled "Connections for Memory Electrode Lines," filed Feb. 26, 2013, and is related to U.S. patent application Ser. No. 13/651,326 by Flores et al., entitled "Metallization Scheme for Integrated Circuit," filed on Oct. 12, 2012, now U.S. Pat. No. 9,025,398, issued May 5, 2015, U.S. patent application Ser. No. 13/651,149 by Castro et al., entitled "Memory Device Architecture," filed on Oct. 12, 2012, now U.S. Pat. No. 9,190,144, issued Nov. 17, 2015, and U.S. patent application Ser. No. 13/651,234 by Castro et al., entitled "Interconnection for Memory Electrodes," filed Oct. 12, 2012, now U.S. Pat. No. 8,891,280, issued Nov. 18, 2014, each of which is assigned to the assignee hereof.

TECHNICAL FIELD

Embodiments of the present invention generally relate to integrated circuits and more specifically to architecture embodiments of cross-point memory devices.

BACKGROUND

There are many different types of memory, including random-access memory (RAM), read only memory (ROM), dynamic random access memory (DRAM), synchronous dynamic random access memory (SDRAM), resistive memory, and flash memory, among others. Types of resistive memory include phase change memory, programmable conductor memory, and resistive random access memory (RRAM), among others. Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices. Various resistive memory devices can include arrays of cells organized in a cross point architecture. In such architectures, the memory cells can include a cell stack comprising a storage element, e.g., a phase change element, in series with a select device, e.g., a switching element such as an ovonic threshold switch (OTS) or diode, between a pair of conductive lines, e.g., between an access line and a data/sense line. The memory cells are located at the intersections of a word line and bit line and can be "selected" via application of appropriate voltages thereto.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIG. 3C is an illustration depicting staggered word lines and bit lines and their relationship to socket interconnect regions for a memory architecture with the pattern of FIG. 3A, according to an embodiment.

FIGS. 5A-5D are illustrations depicting example electrode line layouts in a socket interconnect region for example implementations of a memory array.

Figure 1:
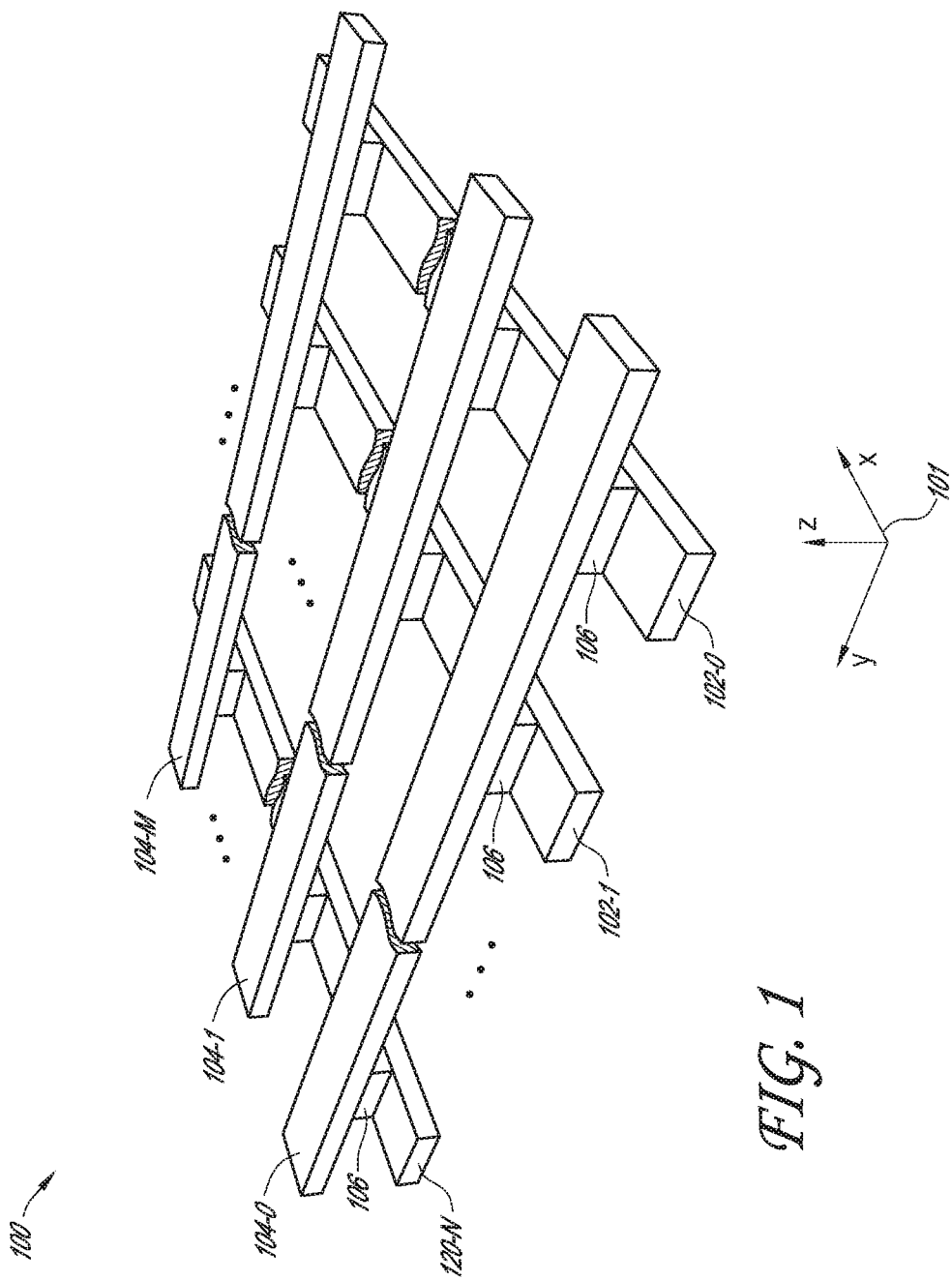
FIG. 1 is an illustration depicting a perspective view of a portion of a memory array, according to an embodiment.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural and/or logical changes may be made without departing from the scope of claimed subject matter. It should also be noted that directions and/or references, for example, up, down, top, bottom, and so on, may be used to facilitate discussion of drawings and are not intended to restrict application of claimed subject matter. Therefore, the following detailed description is not to be taken to limit the scope of claimed subject matter and/or equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Integrated circuits, such as integrated circuit memory devices, include multiple layers of material typically built on a substrate. The material layers include conductive metal layers that interconnect circuit devices. Elongate conductive lines in an integrated circuit include interconnects; lines that also function as electrodes for semiconductor devices (e.g., switches and/or memory storage elements) can be referred to as electrode lines. Conductive lines formed from a layer or layers at the same vertical level can be referred to collectively as a metal level, though the material can be formed from non-metal conductors such as doped semiconductor layers (e.g., polysilicon) or metallic alloys such as metal nitrides, metal carbides and metal silicides. Contacts formed between metal levels can be referred to as vertical connectors or contact vias. Such vertical connectors can be formed separately from the lines they connect, or can be simultaneously formed with overlying conductive lines in a dual damascene process.

Furthermore, digit lines can be referred to as column electrodes, and references to digit line drivers and driver regions herein are more generally applicable to column drivers and driver regions. An example of a digit line is a "bit line," Similarly, word lines can be referred to as row electrodes, and references herein to word line drivers and driver regions are more generally applicable to row drivers and driver regions. The skilled artisan will appreciate that row column electrodes need not be perpendicular; rather, an array can be configured in a manner in which the row and column electrodes cross one another at non-perpendicular angles.

In embodiments described herein, row and column driver regions (or word line and digit line driver regions) are described as including row driver circuits and column driver circuits. In addition to driver circuitry, the circuit level described below can include distributed or contiguous additional circuitry for operation of the memory array within the shared footprint with a memory array, such as global drivers, repeaters, write circuits, sense amplifiers, word decoders, digit decoders, etc. Collectively these circuits can be referred to as logic circuitry for the memory array. For example, digit line drivers, sense circuitry and digit decoders can be formed within column driver regions; word line drivers, word decoders, write circuits, global drivers and repeaters can be formed within column drivers. The skilled artisan will appreciate that different types of logic circuits can be distributed differently among the row and column driver regions described herein, and that in some embodiments the additional circuitry can be within the footprint of the memory array but outside the driver regions. Some types of logic circuitry can remain outside the footprint of the memory array.

As explained above, a memory device may include memory cells arranged in an array format. A memory array generally may include two conductive, or semi-conductive, orthogonal lines referred to as an access line, such as row electrode in the form of a word line, and a data/sense line, such as a column electrode in the form of a digit line, that are used to program, erase, and read a memory cell. Word lines and digit lines can also serve as electrodes for the memory cells. Although different types of memory cells may be programmed, erased, and read in different manners, word lines and digit lines are typically coupled to respective word line and digit line driver circuitry. As used herein, the term "substrate" may include silicon-on-insulator (SOI) or silicon-on-sapphire (SOS) technology, doped and undoped semiconductors, epitaxial layers of silicon supported by a base semiconductor foundation, complementary metal oxide semiconductors (CMOS), e.g., a CMOS front end with a metal backend, and/or other semiconductor structures and technologies. Various circuitry, such as decode circuitry, for example, associated with operating memory array may be formed in and/or on the substrate. Furthermore, when reference is made to a "substrate" in the following description, previous process steps may have been utilized to form regions or junctions in the base semiconductor structure or foundation.

FIG. 1 illustrates a perspective view of a portion of a memory array 100. In this example, array 100 may comprise a cross-point array including memory cells 106 positioned at intersections of a first set of conductive lines 102-0, 102-1, . . . , 102-N, e.g., access lines, which may be referred to herein as word lines, and a second set of conductive lines 104-0, 104-1, . . . , 104-M, e.g., data lines, which may be referred to herein as digit lines. Coordinate axis 101 indicates that the digit lines 104-0, 104-1, . . . , 104-M are oriented in an y-direction and the word lines 102-0, 102-1, . . . , 102-N are oriented in a x-direction, in this example. As illustrated, the word lines 102-0, 102-1, . . . , 102-N are substantially parallel to each other and are substantially orthogonal to the digit lines 104-0, 104-1, . . . , 104-M, which are substantially parallel to each other; however, embodiments are not so limited, and word lines and digit lines can have non-perpendicular orientations. As used herein, the term "substantially" intends that the modified characteristic needs not be absolute, but is close enough so as to achieve the advantages of the characteristic. For example, "substantially parallel" is not limited to absolute parallelism, and may include orientations that are at least closer to a parallel orientation than a perpendicular orientation. Similarly, "substantially orthogonal" is may include orientations that are closer to a perpendicular orientation than a parallel orientation.

Cross-point array 100 may comprise an array structure. As an example, memory cells 106 may comprise phase change random access memory (PCRAM) cells, resistive random access memory (RRAM) cells, conductive bridge random access memory (CBRAM) cells, and/or spin transfer torque random access memory (STT-RAM) cells, among other types of memory cells. In various embodiments, memory cells 106 may comprise a "stack" structure that includes a select device, e.g., a switching device, coupled in series to a storage element, e.g., a resistive storage element comprising a phase change material or a metal oxide. As an example, the select device may comprise a two terminal device, such as a diode, an ovonic threshold switch (OTS), tunnel junctions, or a mixed ionic electronic conduction switch (MIEC), among other two terminal devices. Alternatively, the select device may comprise a three terminal device, such as afield effect transistor (FET) or a bipolar junction transistor (BJT), among other switching elements. Thus, in one example, each memory cell in the array can include a phase change memory storage element as well as a chalcogenide switch.

In a number of embodiments, a select device and a storage element associated with a respective memory cell 106 may comprise series-coupled two-terminal devices. For instance, a select device may comprise a two-terminal Ovonic Threshold Switch (OTS), e.g., a chalcogenide alloy formed between a pair of electrodes, and the storage element may comprise a two-terminal phase change storage element, e.g., a phase change material (PCM) formed between a pair of electrodes. Memory cells 106 including a select device such as an OTS in series with a PCM can be referred to as phase change material and switch (PCMS) memory cells. In a number of embodiments, a middle electrode may be shared between a select device and a storage element of a memory cell 106. Also, in a number of embodiments, the digit lines 104-0, 104-1, ..., 104-M and the word lines 102-0, 102-1, ..., 102-N may serve as top and bottom electrodes corresponding to the memory cells 106.

As used herein, "storage element" may refer to a programmable portion of a memory cell 106, e.g., the portion programmable to a number of different data states. For example, in PCRAM and RRAM cells, a storage element may include a portion of a memory cell having a resistance that is programmable to particular levels corresponding to particular data states responsive to applied programming signals, voltage and/or current pulses, for instance. A storage element may include, for example, one or more resistance variable materials, such as a phase change material. As an example, a phase change material may comprise a chalcogenide alloy such as an indium(In)-antimony(Sb)-tellurium (Te) (IST) material, e.g., $In_2Sb_2Te_5$, $In_1Sb_2Te_4$, $In_1Sb_4Te_7$, etc., or a germanium(Ge)-antimony(Sb)-tellurium(Te) (GST) material, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, etc., among other phase change materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Embodiments are not limited to a particular resistive variable material or materials associated with the storage elements of the memory cells 106. For instance, other examples of resistive variable materials that may be used to form storage elements include binary metal oxide materials, colossal magneto-resistive materials, and/or various polymer based resistive variable materials, among others. Examples of oxide-based resistance variable materials may include metal oxide materials, e.g., NiO, $HfO_2$, $ZrO_2$, $Cu_2O$, $TaO_2$, $Ta_2O_5$, $TiO_2$, $SiO_2$, $Al_2O_3$ and/or alloys including two or more metals, e.g., transition metals, alkaline earth metals, and/or rare earth metals. Although not illustrated in FIG. 1, in a number of embodiments, array 100 may be implemented as part of a three dimensional (3D) architecture, with a number of arrays 100 vertically stacked on each other, for example. In a number of alternative embodiments, the digit lines 104-0, 104-1, ..., 104-M or the word lines 102-0, 102-1, ..., 102-N may form a vertical column along the z-axis.

Figure 2A:
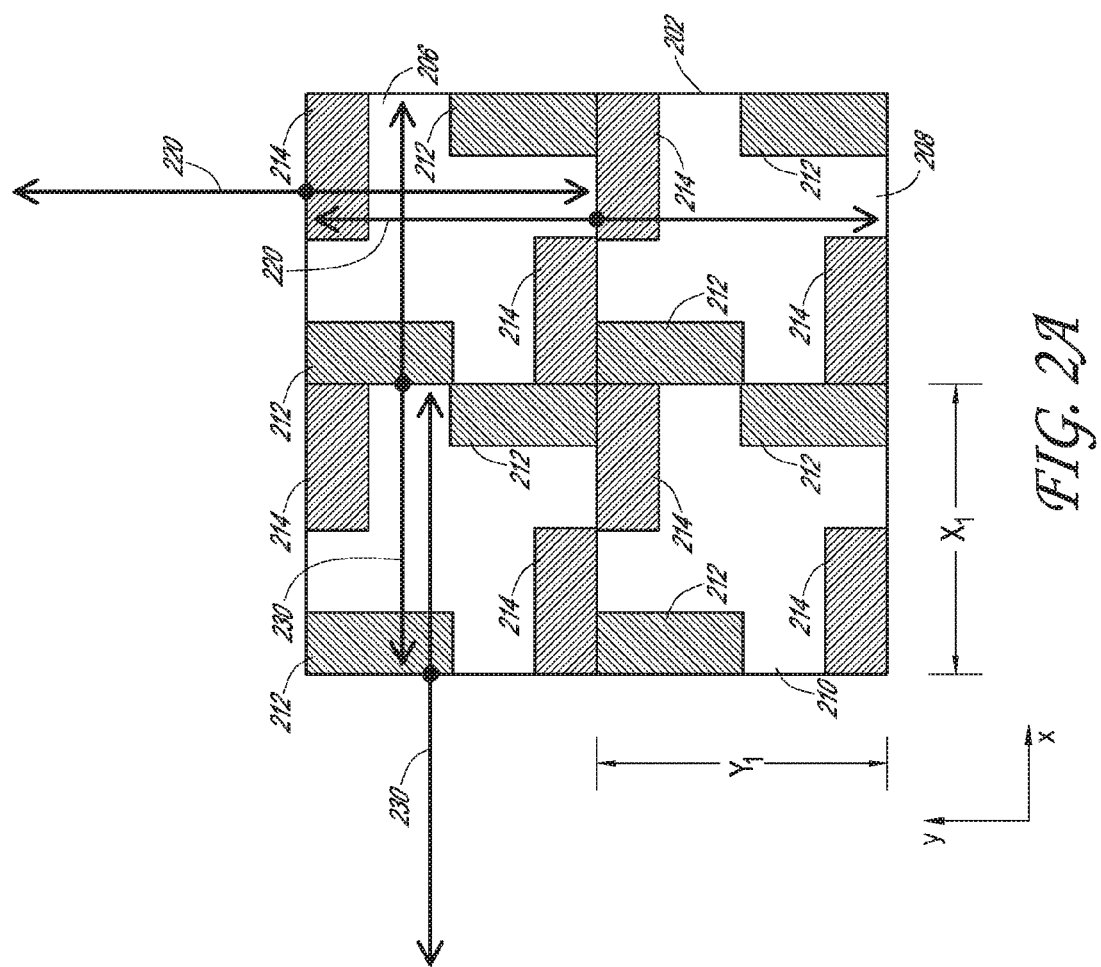
FIG. 2A is an illustration depicting an alternative memory architecture of an active memory array partitioned into multiple sub-arrays with driver circuitry interspersed within the array region, according to an embodiment.

FIG. 2A illustrates a memory architecture 200 including an active memory array 202 partitioned into multiple sub-arrays, also referred to as tiles, in accordance with an embodiment. In this example, there are four sub-arrays 204, 206, 208 and 210 corresponding to one array 202 of FIG. 2A. Word line drivers 212 may be located substantially within a footprint of the active array, under the memory cells, and near the periphery of the sub-arrays. Digit line drivers 214 may also be located substantially within the foot print of the active array, under the memory cells, and near the periphery of the sub-arrays. It will be understood that each shaded area comprises a region that can include multiple driver circuits. In the illustrated embodiment, each individual sub-array layout in a plan view is identical to neighboring sub-arrays. That is, in this embodiment, the word line drivers 212 are in the upper left and lower right corners of each sub-array, and extend generally along the edges extending in the y direction to connect with word lines 230 extending in the x direction. In an example of a PCM array using a 20 nm technology node, the four tiles can occupy the same footprint as between about 100 thousand and 16 million memory cells, depending on the number of decks of memory each tile includes.

Word line drivers 212 may be coupled to a central location of word lines 230 which may cross boundaries between adjacent sub-arrays. As indicated by a dot along each word line 230, the connection point, also known as a socket, between the word line 230 and its driver 212 is positioned centrally along the word line, rather than at an end of the word line 230. In some implementations, the connection point (socket) is closer to a mid-point along the word line 230 than to either end point of the word line 230. In some implementations, the connection point (socket) is positioned a distance of at least 40% of the length of the word line 230 from either end of the word line 230. The total number of digits, e.g., bits, coupled to a physical word line may be the same as a conventionally end-connected word line, and can be the same for each word line in the array, although the distance to the terminal point of the word line from the driver interconnect may vary. For example, in the implementation of FIG. 2A, the word line 230 extends in the x direction from the socket by an equal length of $X_1$ towards the two opposite sides of the x-axis to span a total length of $2X_1$. In other implementations, the word line 230 extends in the x-direction from the socket by different distances towards each of the two opposite sides of the x-axis to span a total length of $2X_1$. In yet other implementations, the word line 230 extends towards opposite sides of the x-axis to span a total length greater than $2X_1$, for instance $4X_1$ or $8X_1$.

The digit line drivers 214 are in the upper right and lower left corners of each sub-array of FIG. 2A, and extend generally along the edges extending in the x-direction to connect with digit lines 220 extending in the y direction. It is noted that the digit line drivers 214 are coupled to a central location of the digit lines 220, as described above for the word lines. The digit lines 220 cross boundaries between adjacent sub-arrays. Further, like the word lines, the digit lines 220 can have generally the same length as conventionally end-connected digit lines, and can be the same for each digit line in the array. For example, in the implementation of FIG. 2A, the digit line 220 extends in the y direction from the socket by an equal length of $Y_1$ towards the two opposite sides of the y-axis to span a total length of $2Y_1$. In other implementations, the digit line 220 extends in the y-direction from the socket by different distances towards each of the two opposite sides of the x-axis to span an total length of $2Y_1$. In yet other implementations, the digit line 220 extends towards opposite sides of the x-axis to span a total length greater than $2Y_1$, for instance $4Y_1$ or $8Y_1$. It will be appreciated by those skilled in the art that the driver circuits can be reversed, for example the word line drivers can be in the lower left and upper right corners of the sub-arrays, as long as all sub-arrays have the same layout.

Figure 2B:
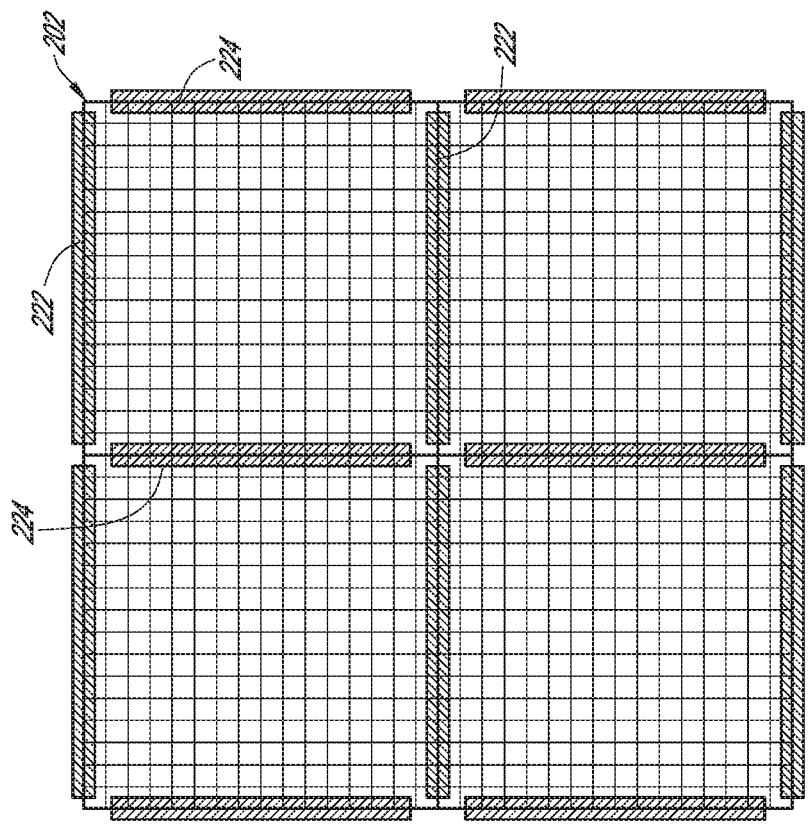
FIG. 2B is an illustration depicting example socket interconnect regions for connecting word lines and bit lines of FIG. 2A to their drivers.
Figure 2B:
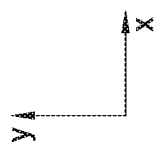

FIG. 2B illustrates socket interconnect regions 224 for the word lines and socket interconnect regions 222 for the digit lines of the array architecture of FIG. 2A. It is noted that the socket regions are at the boundaries of the sub-arrays. By breaking the word and digit line driver groups and socket regions into smaller pieces and staggering the lines 220 and 230, or groups of lines, in alternate rows, as illustrated in FIG. 2A, the digit lines 220 and word lines 230 can extend through the active array 202 and through the socket regions 222 and 224.

Figure 3A:
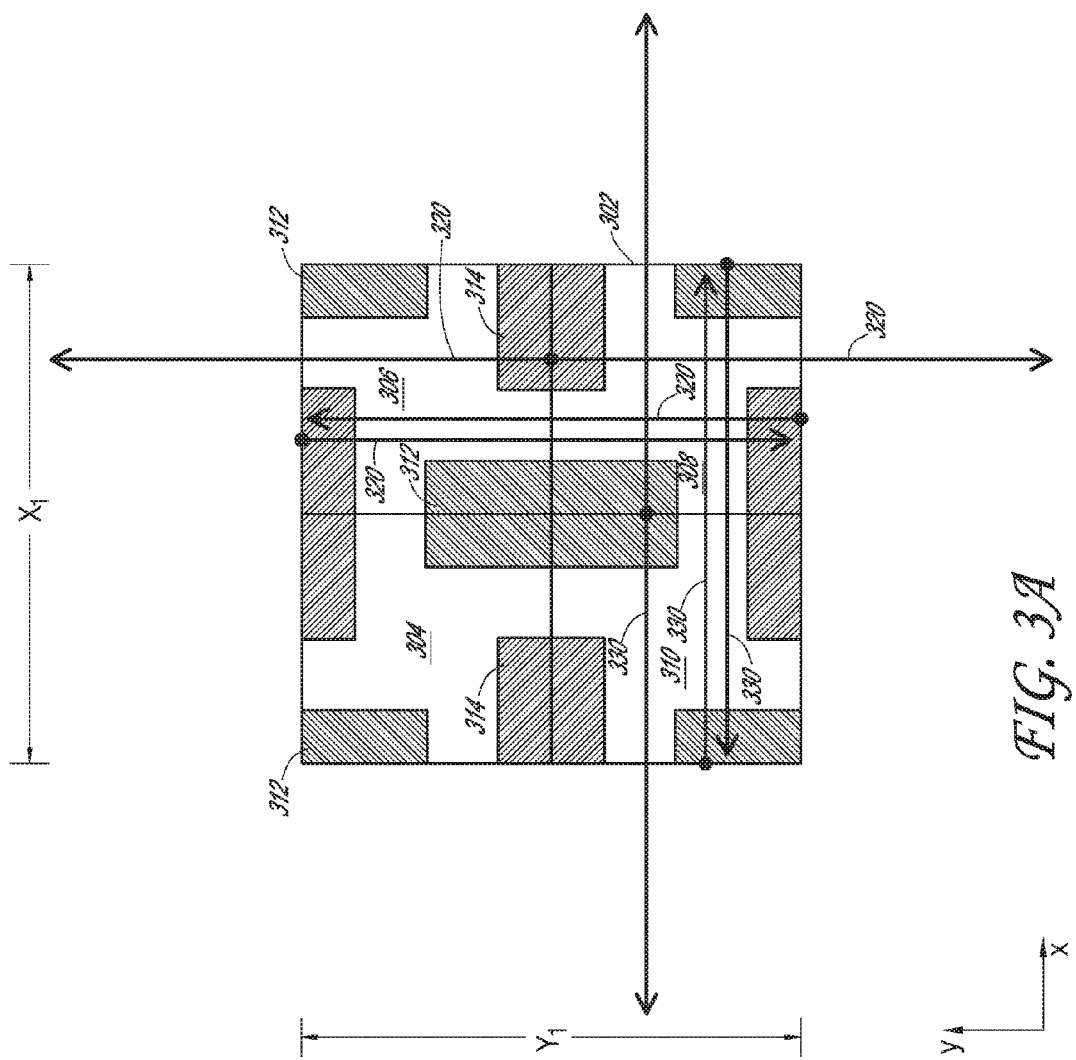
FIG. 3A is an illustration depicting an alternative memory architecture of an active memory array partitioned into multiple sub-arrays with driver circuitry interspersed within the array region, according to an embodiment.

FIG. 3A illustrates an alternative memory architecture 300 of the present invention where the active memory array 302 is partitioned into multiple sub-arrays. In this example, there are four sub-arrays 304, 306, 308 and 310 occupying the same footprint as one sub-array 204 of FIG. 2A. Thus, a length of $Y_1$ spanned by a digit line 320 extending towards one of the two opposite sides of the y-axis is equivalent to a length of two sub-arrays in the y-direction, instead of a length of one sub-array in the y-direction in FIG. 2A. Similarly, a length of $X_1$ spanned by a word line 330 extending towards one of the two opposite sides of the x-axis is equivalent to a length of two sub-arrays in the x-direction, instead of a length of one sub-array in the x-direction in FIG. 2A. Word line drivers 312 may be located substantially within the foot print of the active array and near the periphery of the sub-arrays. Digit line drivers 314 may also be located substantially within the footprint of the active array and near the periphery of the sub-arrays. It will be understood that each shaded area comprises a region that can include multiple driver circuits. In the illustrated embodiment, individual sub-array layouts in a plan view comprise a "mirror" copy of a layout of adjacent sub-arrays. That is, in sub-array 304 the word line drivers 312 are in the upper left and lower right corners of the sub-array, and extend generally along the edges along the y-direction to connect with word lines 314 extending in the x-direction. It is noted that the word line drivers 312 are coupled to a central location of the word lines, which cross boundaries between adjacent sub-arrays. The digit line drivers 314 are in the upper right and lower left corners of sub-array 304, and extend generally along the edges extending in the x-direction to connect with digit lines 320 extending in the y-direction. It is noted that the digit line drivers 314 are coupled to a central location of the digit lines 330 which cross boundaries between adjacent sub-arrays. In adjacent sub-array 306 the word line drivers 312 are in the lower left and upper right corners of the sub-arrays, and extend generally along the vertical edges to connect with horizontally extending word lines. The digit line drivers 314 are in the lower right and upper left corners of the sub-arrays, and extend generally along the edges that extending in the x-direction to connect with digit lines 320 that extend in the y-direction. Thus in a plan view the layout of the drivers is a mirror image between adjacent sub-arrays 304 and 306. Similar mirroring can be seen between sub-arrays 304 and 310, between sub-arrays 306 and 308 and between sub-arrays 310 and 308, as depicted in FIG. 3A.

Figure 3B:
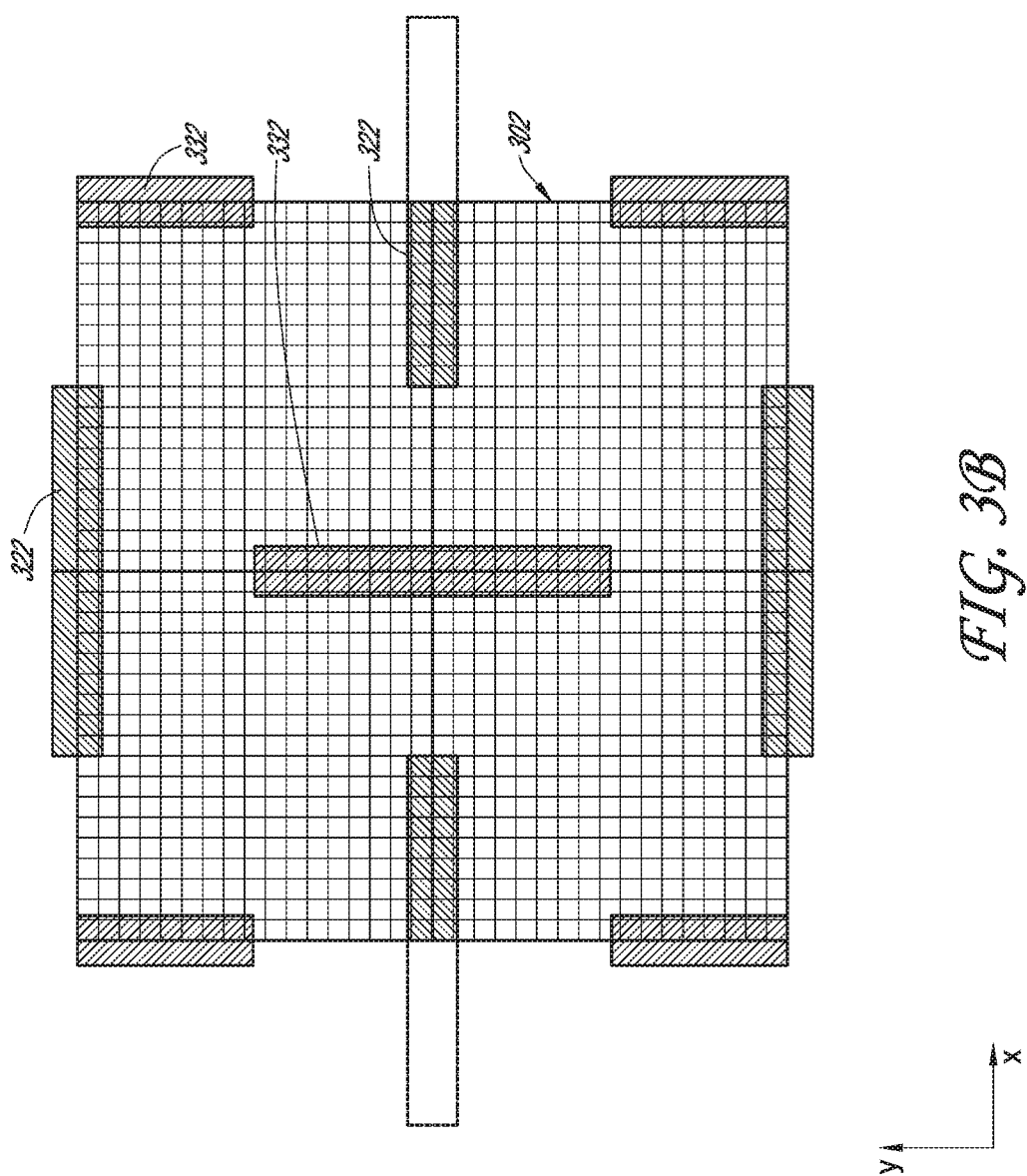
FIG. 3B is an illustration depicting socket interconnect regions for connecting word lines of FIG. 3A to their drivers.

FIG. 3B illustrates the socket interconnect regions 322 for digit lines and socket interconnect regions 332 for word lines of the array architecture of FIG. 3A. It is noted that the socket regions are at the boundaries of the sub-arrays. By breaking the word and digit line drivers and socket regions into smaller segments and staggering the lines or groups of lines in alternate rows, as illustrated in FIG. 3A, the word lines and digit lines can extend through the active array 302 and through the socket regions. Further, the pattern of the socket regions is different from FIG. 2B due to the mirror pattern of the adjacent sub-arrays.

FIG. 3C illustrates locations of multiple digit lines 320 and word lines 330 in relation to their respective interconnect socket regions 322 and 332 for the architecture of FIGS. 3A-3B. Each square can represent one of the sub-arrays 304, 306, 308, 310 of FIG. 3A. In this schematic, an arrow head at the end of an electrode line represents termination of that electrode line at a socket region, whereas a dot in a central region of an electrode line indicates a vertical interconnection being made in a socket region, which will connect to its respective driver. In this example, the boundary region between any two adjacent sub-arrays in the y direction includes a digit line socket interconnect region 322 and an adjacent bare digit line region 340 extending in the x direction. As can be seen from the staggered digit line 320, at any given digit line socket interconnect region 322, some lines horizontally pass through and make vertical connections as indicated by the dots whereas some lines terminate at the socket region as indicated by the arrows. On the other hand, at any given bare digit line region 340, all the lines horizontally pass through uninterrupted. In this illustrated implementation, about half the electrode lines extending into the socket region make vertical connections at the socket region and extend farther into an adjacent sub-array, and about half the electrode lines get terminated at the socket region. FIG. 3C also illustrates that the boundary region between any two adjacent sub-arrays in the x direction includes a word line socket interconnect region 332 and an adjacent bare word line region 342 extending in the y direction. As with the digit lines, word lines 330 are also staggered such that at any given word line socket interconnect region 332, some lines pass through horizontally and make vertical connections, as indicated by the dots, whereas some lines terminate as indicated by the arrows. Also as with the digit lines, at any given bare word line region 342, all lines horizontally pass through uninterrupted. The stagger arrangement illustrated in FIG. 3C is between alternate lines. As will be better appreciated from FIGS. 5A-6B below, the stagger can instead be between alternate bundles of lines, e.g. 8 electrodes terminating in the socket next to 8 electrodes making connections at the socket, or 4/8/4, or 4/4/4/4, etc.

FIG. 3C additionally illustrates digit line seams 350 and word line seams 352. A digit line seam 350 is the space between a digit line 320 passing through a bare digit line region 340 without being interrupted and an adjacent digit line 320 that either terminates or makes a vertical interconnection at a digit line socket region 322. Similarly, a word line seam 352 is the space between a word line 330 passing straight through a bare word line region 342 without being interrupted and an adjacent line that either terminates or makes a vertical interconnection at a word line socket region 332. In an embodiment of the present invention, a digit line seam 350 or a word line seam 352 can have a width having substantially the same dimension as the average distance between adjacent parallel electrodes lines in the array or sub-arrays. That is, no additional space is occupied by a seam compared to an average space width between electrode lines. In other embodiments, the digit line seams may have a substantially greater dimension compared to the average distance between adjacent parallel lines in the array. A further illustration of the relationship of seams as they relate to terminating, interconnecting, and passing-thru electrodes is provided in FIG. 7.

One skilled in the art will recognize that locating the word and digit line drivers is more than mere design choice. Location for the driver circuitry affects performance of the memory and requires substantial architectural changes, as explained below, in the array and metallization layers.

For the particular organization of array drivers and array interconnection points (sockets) in FIGS. 2A-3C, substantial cost reduction can be obtained in the driver (e.g., CMOS) circuitry to drive the array as well as the metal level connections from the driver circuitry to the array of memory cells. The organizations may be referred to as "quilt architectures." FIG. 2A has an advantage of being able to fit all drivers under the array, sharing the same footprint as memory cells in a densely packed manner, as compared to arrangements in which drivers are located at or outside the periphery of the array. The embodiment of FIG. 2A places all drivers under the array by breaking up the driver groups into smaller pieces and locating the sockets in a distributed manner. In an embodiment, an array word lines and digit lines, generally referred to as electrode lines, may be driven from close to or at their midpoints. Driving the electrode lines from their midpoints may confer advantages to drivers due to reduction in IR drop and RC delay as compared to conventional techniques, because the farthest cell along the line is about half the distance as for the farthest cell for electrode lines driven from their endpoints, which can be of significant benefit to certain types of cross-point memory cell technologies. Benefits may be manifested in relaxed transistor requirements, circuit complexity, process complexity or circuit area for the driver circuits, as examples.

The architecture of FIGS. 3A-3C further dissects the driver groups and socket regions into yet smaller pieces. It retains the advantages of centrally driven electrode lines and uses a socket to support such connections. In addition it centers the driver groups with respect to their sockets. This has the additional advantage of reducing the interconnection requirements from driver to socket. This reduced interconnection requirement may manifest itself as a relaxed pitch requirement on interconnect metal layers, or a reduction in the number of interconnect metal layers, with a significant cost advantage as compared to less distributed arrangements with greater average distance from drivers to their respective word or digit lines.

Yet another feature of the architecture of FIGS. 3A-3C is enabled by the placement of the socket regions for crossing (e.g., orthogonal) conductors, in such a way that they do not touch each other. Placing of the socket regions in a disjointed pattern allows the layout of the driver groups to be simplified, since in many memory technologies the drivers of orthogonal electrode lines are designed to employ different transistor types or materials that should be kept separate from each other.

Another feature of the disjointed arrangement of socket regions illustrated in FIGS. 3A-3C is that a significant reduction of operational voltage may be possible due to reduced IR drop. This is because anytime a memory cell is accessed by the selection of a word line electrode and a digit line electrode, the worst case and best case distance of that particular cell from its socket is never the worst case or best case of any two electrode lines from the standpoint of IR drops across the corresponding word line and digit line. As an example, if a memory cell along a word line is farthest away from its socket, its corresponding digit line location cannot also be farthest away from its digit line socket. The same is true of the memory cell along a word line that is closest to its word line socket. This can be a significant performance advantage for memory technologies where that combined distance, which translates into a larger IR drop or longer RC delay, may impact the size of array or limit the operating conditions of the memory device. This advantage may alternatively be manifested further by relaxed driver specifications, such as circuit area, circuit complexity and process complexity, as examples.

An advantage of cross-point memory devices is the ability to "stack" multiple memory cells on top of each other. Because memory cells are located at intersections of word and digit lines, by providing additional word and/or digit lines the density of the memory array can be increased. Each layer of memory cells can be referred to as a deck. For a two deck memory array a digit line layer can be sandwiched between two word line layers. As such, in a two deck memory device the number of word line drivers is doubled thereby increasing the die area occupied by the word line drivers.

As described herein, example quilt architecture embodiments of cross-point memory arrays may utilize pitch multiplication techniques to form and/or terminate word line electrodes and/or digit line electrodes in a manner that allows for efficient connection of the word lines and/or digit lines to underlying metal layers, such as a glue layer. Embodiments described herein may reduce an amount of area required to connect the word lines and/or digit lines to vias that in turn provide electrical connections to driver circuitry positioned beneath the memory array, for example.

Figure 4:
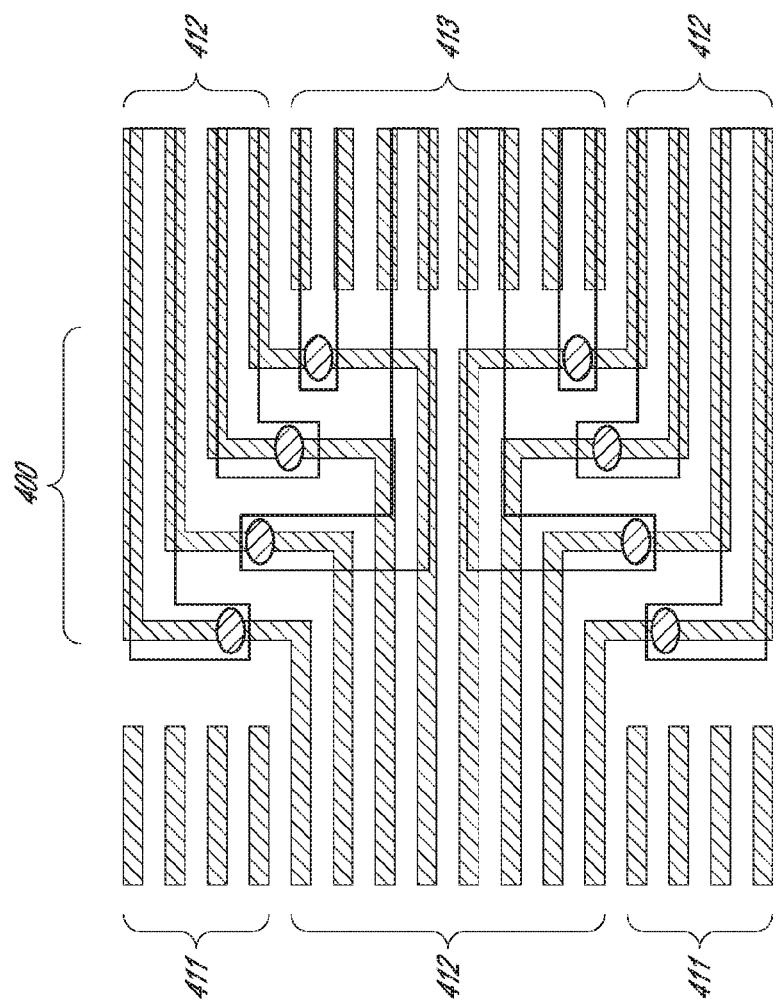
FIG. 4 is an illustration depicting an example configuration of electrode lines coupled to a metallization layer in a socket interconnect region for an example implementation of a memory array.

FIG. 4 is an illustration depicting an example configuration of a plural of electrode lines 410 of a word line layer and/or a digit line layer coupled to a plurality of conductive lines 420 of a metal interconnect layer. In an embodiment, the conductive lines 420 may be vertically positioned below the electrode lines 410. In an embodiment, the plurality of conductive lines 420 of the interconnect layer may be electrically connected to the respective plurality of electrode lines 410 of the digit line and/or word line layer by way of a respective plurality of electrically conductive vertical connectors 430 (represented by ovular dots in FIG. 4). In an embodiment, an electrically conductive vertical connector 430 may be referred to as a "via" or a "contact via."

For clarity of description, the metal interconnect level in which the conductive lines 420 are formed can be referred to herein as a "glue layer." The glue layer is provided with this label to distinguish lower metal interconnect levels. The function of the glue layer is to carry out the connections between the array electrode lines 410 in FIG. 4) and the lower layers of the driver circuits (illustrated in FIGS. 2A and 3A). However, the glue layer can be a patterned metal layer, like the other metal layers. Similarly the digit lines and word lines 410 can be referred to as "electrodes," alternatively as "electrode lines," simply to distinguish metal lines that form part of the memory array and function as electrodes therein from lower level interconnects that serve to connect semiconductor devices. Like the glue layer, however, these lines can be patterned metal lines, like the other metal layers. Additional metal levels (not shown) can include an M1 level to serve as a local interconnect and for strapping semiconductor diffusion regions, and M2 and M3 levels to as longer distance interconnects leading to the glue layer conductive lines 420.

For the example configuration depicted in FIG. 4, the plurality of word line/digit (WL/DL) electrode lines 410 may be configured into a plurality of bundles, wherein a bundle comprises one or more electrodes grouped together. For example, a bundle 411 may comprise eight electrodes that terminate at socket 400. Also depicted in the example of FIG. 4 is a bundle 413 approaching from the opposite side of the socket 400, comprising an additional eight electrodes that terminate at socket 400. The socket 400 represents the region within the array in which vertical connections are made to the WL/BL electrode lines 410. The bundle 412 may comprise an additional eight electrodes that may be routed through socket 400 and that may be coupled to conductive lines 420 of the glue layer in the socket 400 by way of vertical connectors 430. In the example routing embodiment in FIG. 4, the electrodes within the 412 bundle do not terminate within the socket region 400 and have jog segments within the socket region. Vertical connections may be made at one or more of the jog segments through the vertical connectors 430 between at least a subset of the electrodes within the 412 bundle and the conductive lines 420 positioned vertically below the electrodes.

Making vertical connections at the jog segments of electrode lines within the bundle 412 as illustrated in FIG. 4 may provide several advantages. For example, the pattern in FIG. 4 may provide for an efficient use of the socket area by allowing for positioning of driver circuitry substantially within the footprint of the memory array, as described above. Additionally, the pattern in FIG. 4 may provide for cost effective patterning and subsequent etching to manufacture the vertical connectors 430 using a lithographic resolution that is coarser that that used to pattern the electrode lines 410. Under certain circumstances, the lateral dimension of the vertical connectors 430 may be at least twice a minimum feature size of a memory array, which may be the width of the electrodes lines 410 in a dense array.

Furthermore, the routing example in FIG. 4 may allow greater tolerance against lithographic misalignment of the electrode lines 410 in the y direction in making contacts between the electrode lines 410 and conductive lines 420 through vertical connectors 430. The jog segments may provide for a lithographic misalignment margin between the electrode lines 410 and the vertical connectors 430 that is substantially greater than would otherwise be available in the y direction if there were no jog segments. Because the vertical connector only needs to make contact at a single point within the jog segment, greater length of the jog segment allows for a correspondingly greater amount of lithographic misalignment of the electrode lines 410 relative to the position of the underlying vertical connectors 430. In the illustrated example in FIG. 4, the length of the jog segments in the y direction is approximately equivalent to the distance occupied by about four electrode line widths and four corresponding space widths of the adjacent bundle 411. In this example, if the width of an electrode/space combination is about 2F, where F is the minimum feature size of the memory array, the length of a jog in the y direction would be about 8F. Thus, the lithographic misalignment tolerance between the vertical connector 430 and the electrode lines 410 in the y direction may be as large as approximately 4F minus half the lateral dimension of the vertical connector 430.

The routing example in FIG. 4 may further allow a greater tolerance against lithographic misalignment of the electrode lines 410 in the x direction, due to the vertical connectors 430 having a lateral dimension greater than the width of an electrode line 410. As discussed above, a vertical connector 430 having a larger lateral dimension compared to F allows for a correspondingly larger misalignment in the x direction between the vertical connector 430 and the electrode line 410 without increasing the risk of not making sufficient electrical contact. The spacing in the x direction between adjacent jog segments may also be adjusted similarly to avoid any shorting between two adjacent electrode lines 410 by a vertical connector 430. The greater tolerance arises from the distance in the x direction between adjacent jog segments. In an embodiment, the shortest distance from an edge of one jog segment to a corresponding edge of an immediately adjacent jog segment in the x direction is at least four times the minimum feature size of the memory array (i.e., 4F). In another embodiment, the shortest distance from an edge of one jog segment to a corresponding edge of an immediately adjacent jog segment in the x direction is at least ten times the minimum feature size of the memory array (i.e., 10F). Thus, the routing pattern illustrated in FIG. 4 provides for a cost-effective manufacturing method of making electrical connections between electrode lines 410 with the underlying conductive lines 420 through vertical connectors 430.

In an embodiment, electrode lines 410, including bundles 411-413, may comprise digit line electrodes, and socket 400 may comprise a digit line socket, in which case the axis y of elongation is rotated 90° with respect to the prior figures. However, claimed subject matter is not limited in these respects and the lines may in other embodiments represent memory word lines or other conductive lines for different types of arrays. Further, although groupings of eight electrodes are depicted, claimed subject matter is not limited in scope in this respect.

In an embodiment, pitch multiplication techniques, such as self-aligned double patterning (SADP) techniques, may be utilized to form electrodes for cross-point memory arrays. Utilization of an SADP or other pitch multiplication technique to form electrically conductive lines, such as word lines and digit lines, allows formation of features having dimensions smaller than would otherwise be possible utilizing standard lithographic techniques, and therefore greater memory density may be achieved, among other potential benefits including improved power consumption and device performance, for example. The process is dubbed "self-aligned" because a lithography-defined set of features can be used to derive a denser pattern of features that are self-aligned (without a further mask) to the lithography-defined set of features. For example, photolithography can define a plurality of elongated mask lines, and conformal deposition over the mask lines, followed by spacer etching, can define two spacer lines for every one mask line. After removal of the mask lines, the spacer lines are left with half the pitch (spacing between like features in a repeated pattern) and double the density of the original mask lines. The process is said to be "pitch doubling" employing the converse meaning of pitch to be synonymous with density. Furthermore, by repeating the pitch doubling technique twice, spacer lines having a quarter of the pitch and quadruple the density of the original mask lines may be formed. The process is said to be "pitch quadrupling," which is an extension of pitch doubling. More generally therefore, techniques that form multiple features for a single conventionally defined (e.g., photolithographicaily defined) feature is known as "pitch multiplication."

FIGS. 5A-6B illustrate further embodiments for effective routing of electrode using pitch multiplication techniques. In FIGS. 5A-6B, patterns using pitch multiplication techniques define conductive lines from conventionally-defined "core" patterns. The skilled artisan will appreciate that the illustrated patterns can be formed at higher masking levels and transferred down through hard mask and selective etching techniques. Moreover, generally a hard mask is first formed in the pattern shown for the conductive lines. The core material is then removed, and a series of subsequent steps (e.g., damascene processing) can convert the hard mask pattern (e.g., spacer pattern) into a similar pattern of conductive material. The core material may or may not co-exist simultaneously with the conductive material, and may or may not be formed at the same vertical level. Thus, the schematic illustrations are only meant to convey the relative positions of the core material, which can also be referred to as a "mandrel," and the conductive lines ultimately formed by the pitch-multiplication technique.

FIGS. 5A-5D illustrate example layouts of the socket area 500 of a memory array at an intermediate stage of an example manufacturing process. In an embodiment, pitch multiplication techniques such as SADP may be utilized to form core material 510 and to form electrodes 520 using the pattern of spacers formed on sidewalls of the core material 510. For the examples depicted in FIGS. 5A-5D and 6A-6B, electrodes 520 may comprise digit line electrodes, in which case the axis y is rotated 90° relative to the prior figures, although claimed subject matter is not limited in this respect. Similar to FIG. 4, a plurality of electrodes 510 in the socket area 500 includes a pass-through bundle 512 that traverses the socket area 500 without being terminated, and a terminated bundle 513 that terminates within the socket area 500. As in FIG. 4, electrode lines within the pass-through bundle 512 have jogs that may connect to underlying conductive lines such as conductive lines 420 through vertical connectors (not shown).

FIGS. 5A-5D further depict loops 525 of electrodes 520. Loops 525 are depicted for the terminated bundle 513 that is internal to a pass-through bundle 512 that passes through the socket area 500 in an example configuration, although claimed subject matter is not limited in scope in this respect. A mask pattern 530 for omitting loop ends of the spacer pattern is also depicted in FIGS. 5A-5D. The mask pattern 530 may be a "chop" mask utilized during a subtractive metal patterning process to etch away portions of electrodes 520 positioned beneath the chop mask; thus the mask pattern 530 may represent an opening in a mask layer through which etchant can reach the loop ends of the spacer pattern. Loops 525 of electrodes 520 are to be etched utilizing chop mask 530 in order to eliminate what would otherwise be electrical short-circuits between adjacent electrodes. As will be seen in FIGS. 5B-5D and 6A-6D, a number of configurations for loops 525 are possible for various embodiments.

It will be understood that in a subtractive metal process, the chopping or etching of loop ends may be performed on the electrode material itself or may be performed on a hard mask version of the spacer pattern in upper levels before using the spacer pattern to produce the electrodes 510. Alternatively, in a damascene process, the mask pattern 530 may represent a "blocking mask" rather than a chop mask. In that case, the mask pattern 530 can represent a mask over the loop ends of a hard mask that includes the spacer pattern; the blocking mask can prevent transfer of the loop end portions of the spacer pattern while the remainder of the spacer pattern is transferred by etching into a lower dielectric layer to form trenches for a damascene metallization process.

In the illustrated examples of FIGS. 5A-5D, the mask pattern 530 may advantageously be a noncritical mask. A noncritical mask is a mask whose lithographic resolution is coarser than the minimum feature size of the memory array. In a pitch-multiplication technique, the lithographic resolution of a noncritical mask would be greater than F times a multiplication factor, wherein F is the minimum feature size of the memory array and the multiplication factor would be greater than 2 or greater than 4 for pitch-doubling and pitch-quadrupling, respectively. Having as few critical masks as possible is advantageous for many manufacturing technologies because critical masks require advanced lithography capabilities that are costly.

In the illustrated examples described in FIGS. 5A-5D, a non-critical mask pattern 530 is employed such that the electrodes 520 entering the socket area 500 from the outside comprise the bundles 513 and 512. The electrodes within the bundle 513 extend in the y direction and terminate at the socket area 500. The terminated bundle 513 includes at least two electrodes that co-terminate at substantially the same position along the y direction. The terminated bundle 513 further includes at least one electrode that does not co-terminate at substantially the same position as the co-terminating electrodes and extends farther along the y direction into the socket area 500, yet does not pass through the socket area 500. In an embodiment, the terminated bundle 513 may comprise at least four electrodes. In another embodiment, electrodes within the terminated bundle 513 that do not co-terminate includes a bend in the socket area 500 such that they deviate substantially from y direction before terminating. In another embodiment, the electrodes within the terminated bundle 513 that do not co-terminate include at least two outer lines that include inward jogs before terminating. In yet another embodiment, the shortest distance in the x direction from an edge of one of the co-terminating electrode to an opposite edge of an immediately adjacent conductive electrode that does not co-terminate is approximately equal to the minimum feature size F of the memory array. Each of the electrodes within the bundle 512 extends through the socket region and includes a jog segment within the socket area 500, wherein each jog segment extends in a direction that deviates from the y direction. In addition, similar to FIG. 4, although not shown in FIGS. 5A-5D for clarity, conductive vertical connectors are positioned within the socket area 500 such that at least one of the conductive vertical connectors contact one of the jog segments of the electrodes within the bundle 512 of electrode lines 410 that pass through the socket area 500. In an embodiment, the pass-through bundle 512 may comprise at least four electrodes.

Figure 5A:
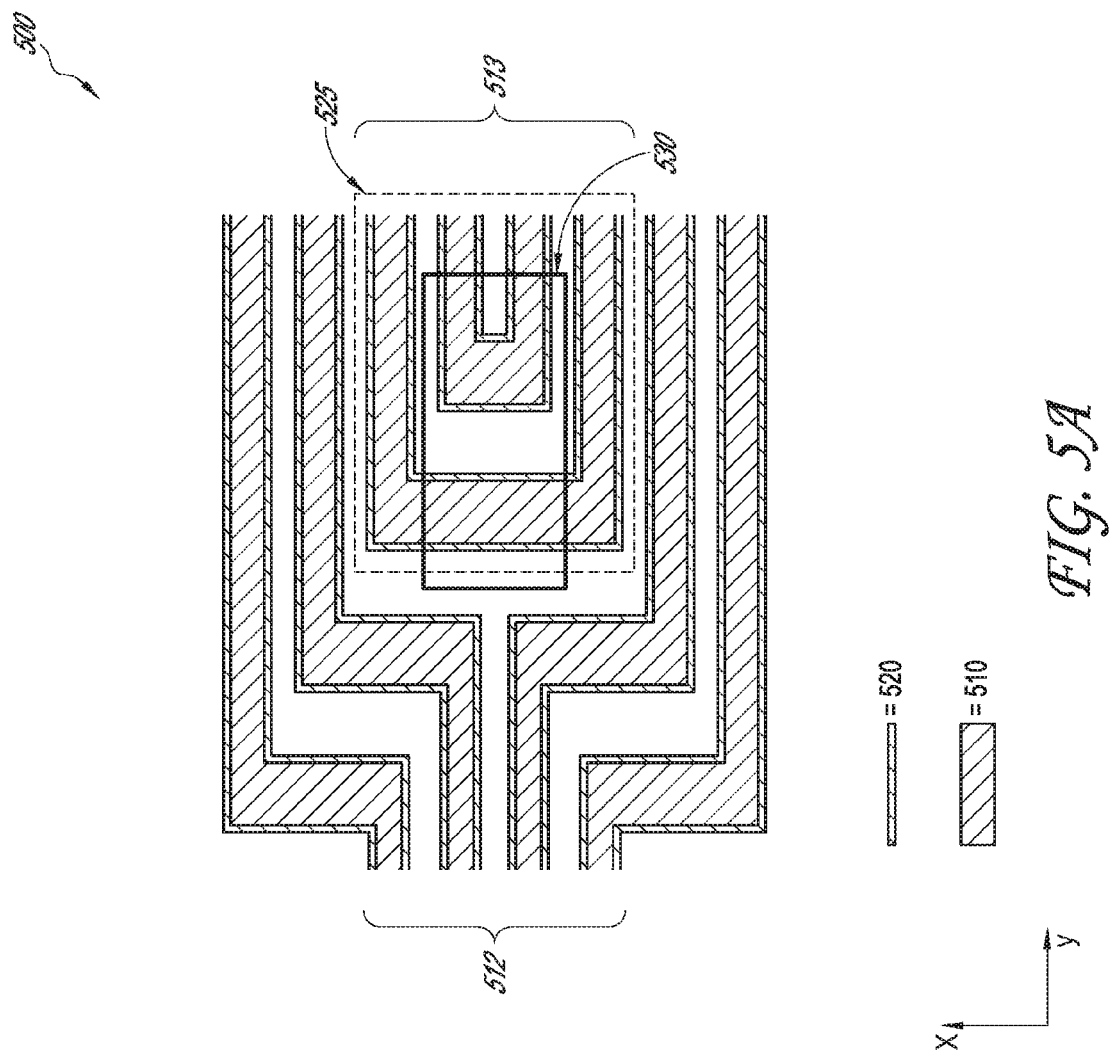

Particularly in FIG. 5A, the terminated bundle 513 includes eight electrodes and the pass-through bundle 512 includes eight electrodes. The terminated bundle 513 includes four inner electrodes that co-terminate at substantially the same position along the y direction. In addition, the terminated bundle 513 includes four outer electrodes that do not co-terminate at substantially the same position as the co-terminating electrodes and extend farther along the y direction into the socket region. In addition, as illustrated, due to the width of mask pattern 530 in the x direction being smaller than the width in the x direction of the outermost loop within the loops 525, the four outer electrodes that do not co-terminate bend to extend in a direction that deviates from parallel to the y direction before terminating. Additionally in FIG. 5A, the pass-through bundle 512 includes eight electrodes that extend through the socket 500, wherein each electrode of the pass-through bundle 512 includes a jog segment within the socket 500 that deviates from the y direction. In FIG. 5A, the jog extends in the x direction, which is approximately perpendicular to the y direction. It is noted that a first group comprising half of the electrodes within the pass-through bundle 512 has jog segments deviating from the y direction towards one side and a second group comprising the other half of the electrodes within the bundle 512 has jog segments deviating from the y direction towards the opposite side. For example, in FIG. 5A, half of the jog segments extend in the positive x direction, while half of the jog segments extend in the negative x direction.

In addition, although not shown in FIG. 5A, it will be understood that the mask pattern 530 may not be symmetrically positioned in the x direction relative to the electrodes within the terminated bundle 513. For example, the mask pattern 530 may be positioned closer to one side of the outermost loop of loops 525 in the x direction compared to the opposite side of the outermost loop. In that case, two non-co-terminating electrodes within the terminated bundle 513 formed from the same loop will terminate at substantially different positions in either the x or y directions, depending on where the electrodes are terminated relative to the corner of the loop from which the electrodes are formed from.

Advantageously, in the illustrated embodiment of FIG. 5A, the mask pattern 530 is a non-critical mask because the individual electrodes within the terminated bundle 513 do not need to be co-terminated along the y direction for functionality. Ensuring co-termination of all the individual electrodes 520 within the terminated bundle 513 at substantially the same position along the y direction would entail a critical mask that has a lithographic misalignment tolerance comparable to the dimension of a space width in the x direction between two adjacent electrodes, which may be the minimum feature size F of the memory array. In contrast, in circumstances such as that in FIG. 5A, the mask pattern 530 effectively terminates all the electrodes in the terminated bundle 513 with a mask pattern 530 that has an area large enough to terminate all individual electrodes within the terminated bundle 513 in either x or y direction. In an embodiment, the mask pattern 530 has a printed length in the y direction or a printed width in the x direction exceeding four times the minimum feature size F. In another embodiment, the mask pattern 530 has a printed length in the y direction or a printed width in the x direction exceeding ten times the minimum feature size F. In an embodiment, the misalignment tolerance of the mask pattern 530 in the x direction is at least twice the minimum feature size F. In another embodiment, the mask pattern 530 has a printed width in the x direction exceeding four times the minimum feature size F. Thus, the configuration of FIG. 5A may allow significant flexibility in manufacturing and design, based on appropriate trade-off considerations related to area occupancy of the socket 500, and the cost associated with the criticality of the mask pattern 530.

Figure 5B:
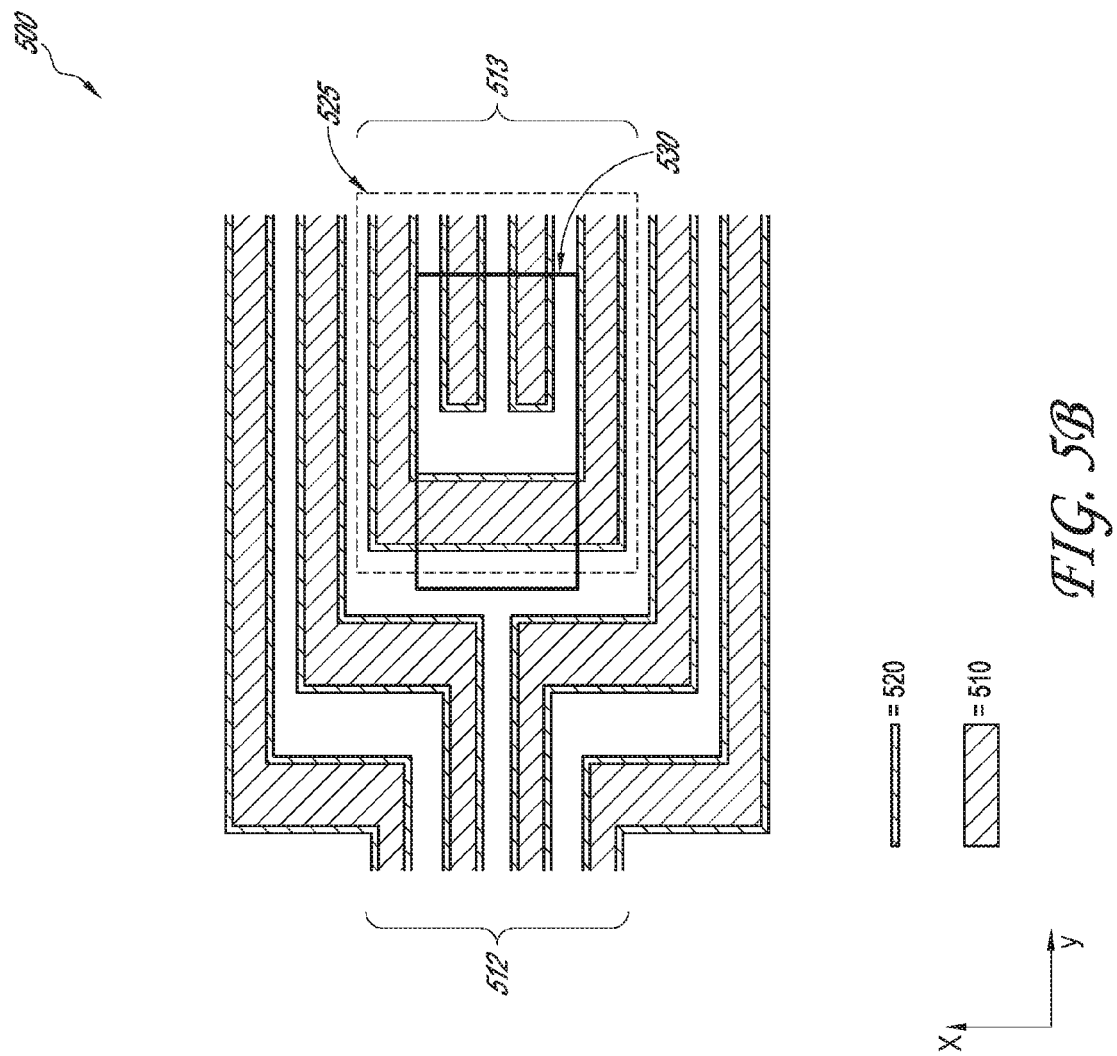
Figure 5D:
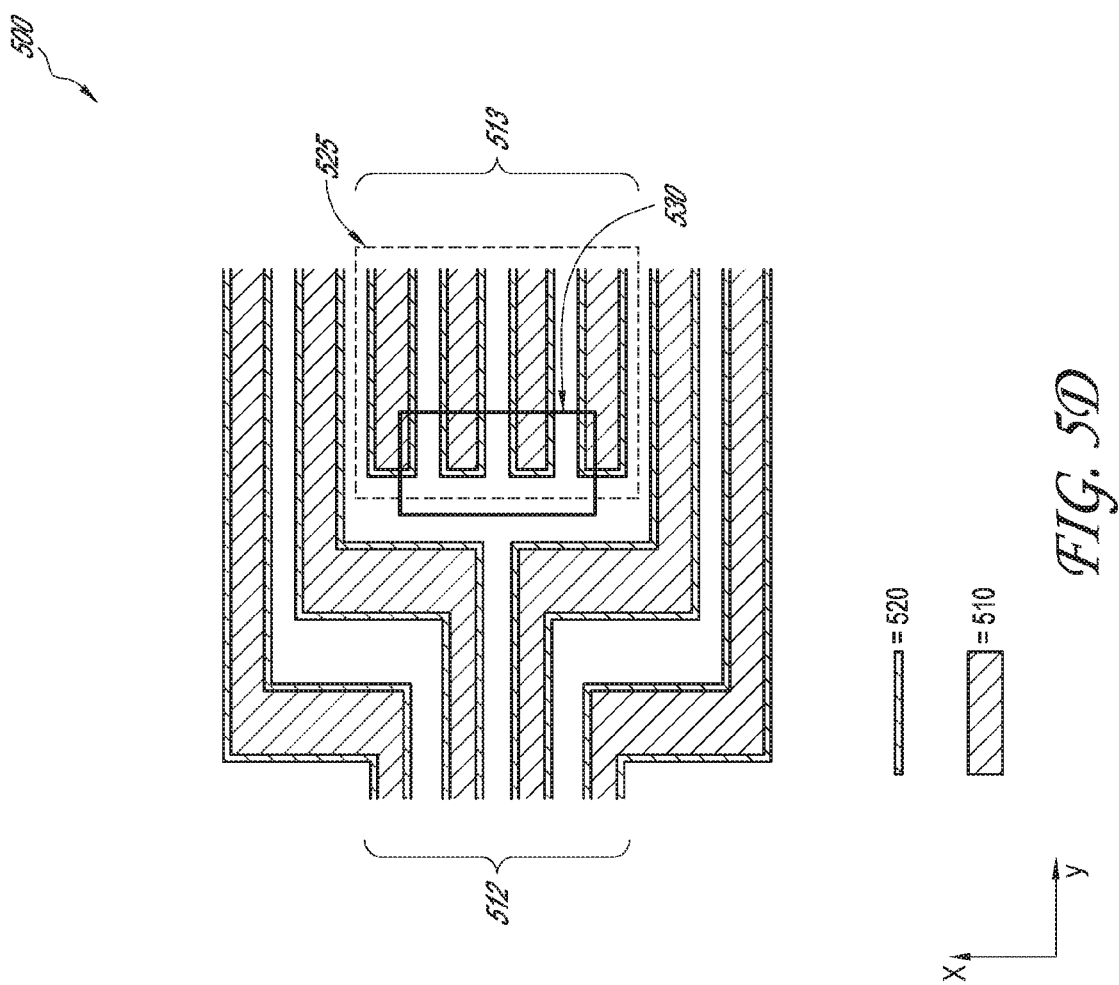

FIGS. 5B-5D illustrate additional example layouts of a socket area 500 for additional example embodiments of a memory array at an intermediate stage of an example manufacturing process. The examples of FIGS. 5B-5D depict alternative example configurations for loops 525 of electrodes 520. As mentioned above, mask pattern 530 may be utilized during the manufacturing process to omit the loop end portions of the spacer pattern from the pattern of the electrodes 520. As also mentioned above, determination of an appropriate configuration for loops 525 of electrodes 520 may be based, at least in part, on trade-off considerations related to area occupancy of the socket 500 and the criticality of the mask pattern 530. Such trade-offs may be considered by a circuit designer, and an appropriate configuration may be selected.

FIGS. 5A-5D demonstrate that different mask patterns 530 and electrode patterns choices can result in differently shaped regions open for vertical connections, while still benefiting from pitch multiplication techniques and allowing about half the electrodes to pass through while about half the electrodes terminate at the socket area 500 without necessarily entailing a critical mask for terminating pitch multiplied lines. Therefore, all prior discussions regarding the size and positioning of the mask pattern 530 in connection with FIG. 5A apply in a similar manner to FIGS. 5B-5D.

Particularly, in FIG. 5B, the terminated bundle 513 includes eight electrodes and the pass-through bundle 512 includes eight electrodes as in FIG. 5A. Also as in FIG. 5A, the terminated bundle 513 includes four inner electrodes that co-terminate at substantially the same position along the y direction and four outer electrodes that do not co-terminate at substantially the same position as the co-terminating electrodes and extend farther along the y direction into the socket area 500. Also similar to FIG. 5A, the pass-through bundle 512 includes eight electrodes that extend through the socket area 500, wherein each electrode 520 of the pass-through bundle 512 includes a jog segment within the socket area 500 that extends in a direction that deviates from the y direction. In contrast to FIG. 5A, only two outer electrodes within the terminated bundle 513 that do not co-terminate with the others deviate from parallel to the y direction before terminating, instead of four as in FIG. 5A. In addition, two electrodes that do not co-terminate with the remaining electrode lines 520 of the terminated bundle do not include inwards jogs before termination.

In FIG. 5C, the terminated bundle 513 includes eight electrodes and the pass-through bundle 512 includes eight electrodes as in FIG. 5A. Similar to FIG. 5A, the pass-through bundle 512 includes eight electrodes that extend through the socket area 500, wherein each electrode 520 of the pass-through bundle 512 includes a jog segment within the socket area 500 that deviate from the y direction. In contrast to FIG. 5A, the terminated bundle 513 includes six inner electrodes that co-terminate at substantially the same position along the y direction and only two outer electrodes that do not co-terminate at substantially e same position as the remaining electrodes of the bundle 513, and extend farther along the y direction into the socket region. Also in contrast to FIG. 5A, only two outer electrodes that do not co-terminate with the remaining electrodes of the bundle 513 deviate from parallel to the y direction before terminating, instead of four in FIG. 5A.

In FIG. 5D, the terminated bundle 513 and the pass-through bundle 512 that result from termination using the mask pattern 530 is identical to FIG. 5C in terms of the number of co-terminating electrodes and the number of electrodes that do not co-terminate with the remaining electrodes of the bundle 513. However, in comparison with FIG. 5C, the six electrodes that co-terminate extend farther into the socket area 500 before terminating. This results from the fact that, as illustrated, the six co-terminating electrodes in FIG. 5D originate from terminating using the mask pattern 530 loops 525 that include four identical rectangular loops, whereas the six co-terminating electrodes in FIG. 5C originate from terminating loops 525 that include two loops each having an inner loop.

A skilled artisan will appreciate that the different patterns can be variously useful for interconnection of ends of the terminated electrode bundle 513 and/or for creating room for vertical connectors to pass through the socket area 500 undisturbed and unconnected with the electrodes 520 of the illustrated metal level. It will also be noted that the core 520 and spacer 510 patterns for the terminated electrode bundle 513 in FIGS. 5A-5D are different from one another.

Figure 6A:
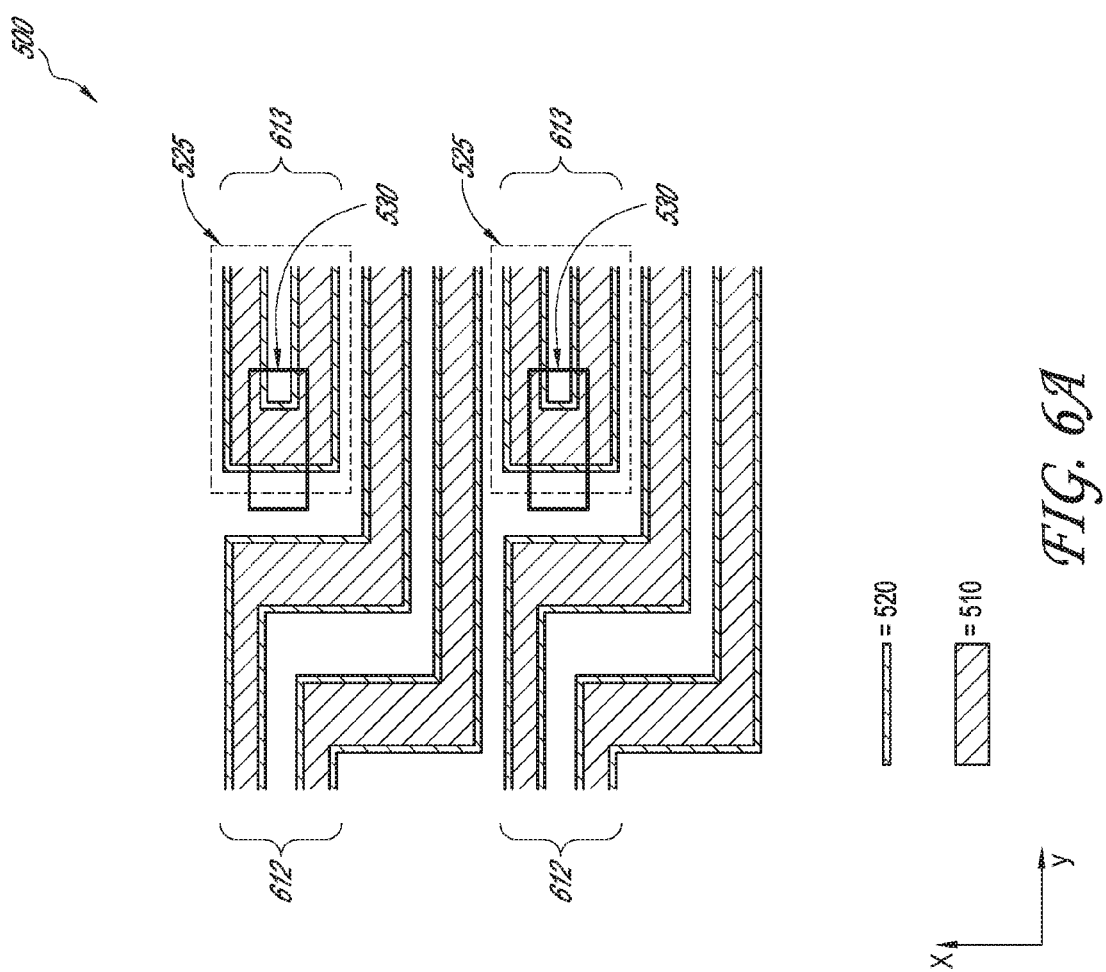
FIGS. 6A-6B are illustrations depicting additional example electrode line layouts in a socket interconnect region for example implementations of a memory array.
Figure 6B:
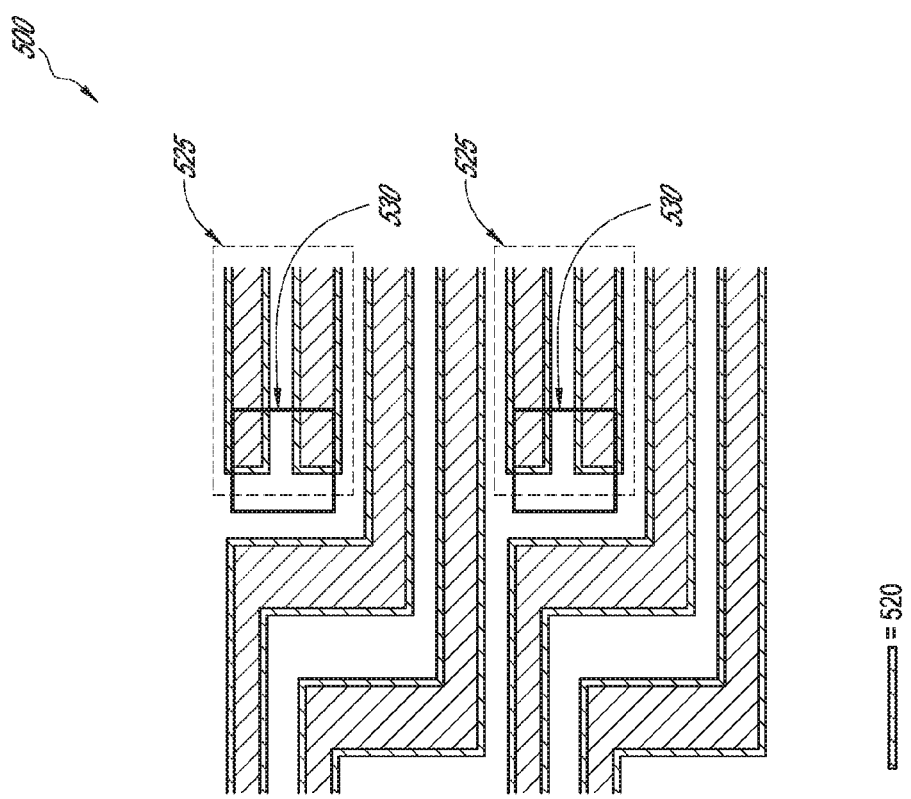

FIGS. 6A and 6B depict additional example embodiments of socket area 500 for additional example embodiments of a memory array. The examples depicted in FIGS. 6A and 6B are variations of the configurations depicted in FIGS. 5C and 5D, in that some of the bundles of electrodes may be viewed as having been "flipped" in order to help management of via positioning. In particular, one of the pass-through bundles 612 that passes through the socket area 500 now intervenes between separated terminated bundles 613, such that mask patterns 530 create two regions for separated vertical connectors, where a single larger region is defined by corresponding mask patterns 530 of FIGS. 5A-5D. In contrast to FIGS. 5A-5D, all electrodes within the pass-through bundles 612 have jog segments deviating from the y direction towards the same side. The examples of FIGS. 6A and 6B may also provide more compact solutions for sub-array boundary layout, although the patterning resolution of chopping or blocking mask pattern 530 may be very fine such that margins for misalignment may have been reduced. As noted in FIGS. 6A and 6B, loops 525 have been configured in two subsections, as has mask pattern 530.

Claimed subject matter is not limited in scope to the specific example configurations described herein and/or depicted in FIGS. 5A-5D and FIGS. 6A-6B. Each of the examples illustrate patterns that can be used with pitch multiplication in which each socket area allows half the wires to pass through the socket area and half the wires terminate at the socket area, while room is created for vertical conductors to pass through to higher or lower layers. For example, in the regions designated by the mask pattern 530, vertical connectors can pass through undisturbed to connect lower levels to higher levels (e.g., glue layer to upper deck of word lines or digit lines); can connect with terminated electrodes 513/613; or can connect to a central point along electrodes 512/612 that pass through the socket area.

Figure 7:
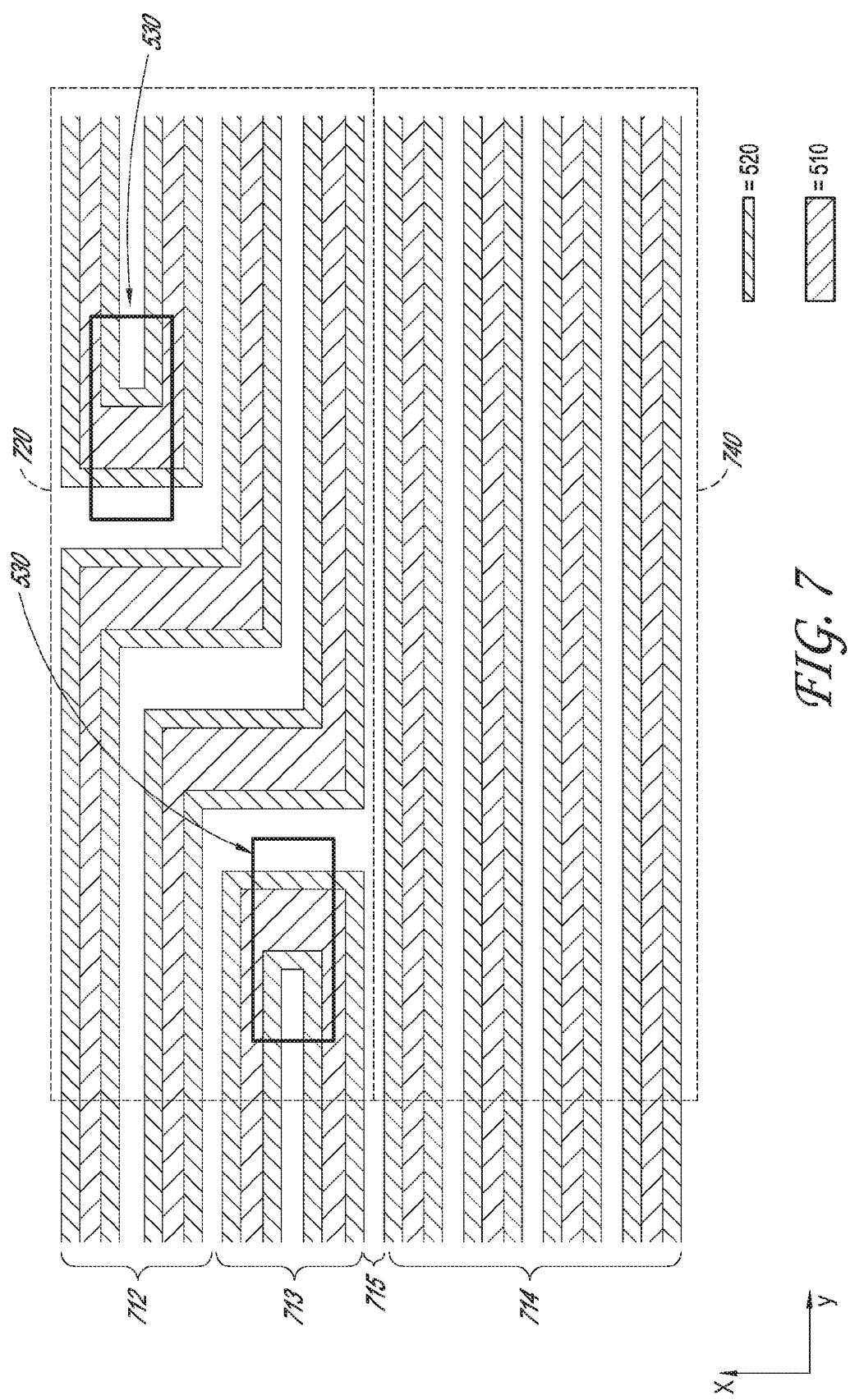
FIG. 7 is an illustration depicting an example configuration of electrode lines in a socket interconnect region and electrode lines in an adjacent bare line region for an example implementation of a memory array.

FIG. 7 illustrates an embodiment for minimizing space between electrode bundles using the general techniques illustrated in FIGS. 3C and 5A-6B. As explained in connection with FIG. 3C, a boundary region between two adjacent sub-arrays in the y direction includes a digit line socket region 720 and a bare digit line region 740 adjacently located in the x direction, in which various configurations of electrodes 520 exist. While FIG. 7 illustrates digit lines, a similar arrangement may be utilized for word lines to achieve the same effect.

The embodiment in FIG. 7 includes a bundle of digit lines 714 extending straight and parallel to one another in the y direction and passing through the bare digit line region 740. Additionally, a pass-through bundle of digit lines 712 extend parallel to the y direction and pass through the digit line socket region 720 adjacent to the bare digit line region 740. As in FIGS. 5A-6B, each of the digit lines in the pass-through bundle of digit lines 712 has a horizontal jog in the socket region 740. The embodiment in FIG. 7 further includes a terminated bundle of digit lines 713 extending parallel to the y direction into the digit line socket region 720 and terminating therein. The terminated bundle of digit lines 713 includes two digit lines that co-terminate at substantially the same position along the y direction and two digit lines that do not co-terminate with the co-terminating lines and extend farther along the y direction into the socket region 740. As described above in reference to FIG. 3C, the bundle of digit lines 714 that extend straight through the bare digit line region 740 is separated from the pass-through bundle of digit lines 712 and the terminated bundle of digit lines 713 by a digit line seam 715 extending in the y direction.

As similarly illustrated in FIGS. 5A-6B, a noncritical mask pattern 530 is used in FIG. 7 to terminate the digit lines within the terminated bundle of digit lines 713 at different positions along the y direction. Similar to the embodiment of FIGS. 5A-6B, in FIG. 7 the two outer digit lines within the terminated bundle of digit lines 713 that do not co-terminate extend farther along the y direction into the socket region 740 and deviate substantially from the y direction before terminating. As a result, any additional space for the digit line seam 715 to accommodate for lithographic misalignment of the mask pattern 530 is minimized. In the illustrated embodiment in FIG. 7, the width of the digit line seam 715 in the x direction is substantially the same as the spacing between two immediately adjacent digit lines within the bundle of digit lines 714, which may be the minimum feature size F of the memory array. In another embodiment, the width of the digit line seam 715 does not exceed twice the spacing between two immediately adjacent digit lines within the bundle of digit lines 714, or 2F. In yet other embodiments, the digit line seam 715 may have a seam space width greater than twice the spacing between two immediately adjacent digit lines within the bundle of digit lines 714, or greater than 2F, to accommodate a higher degree of lithographic misalignment of the mask pattern 530.

Figure 8:
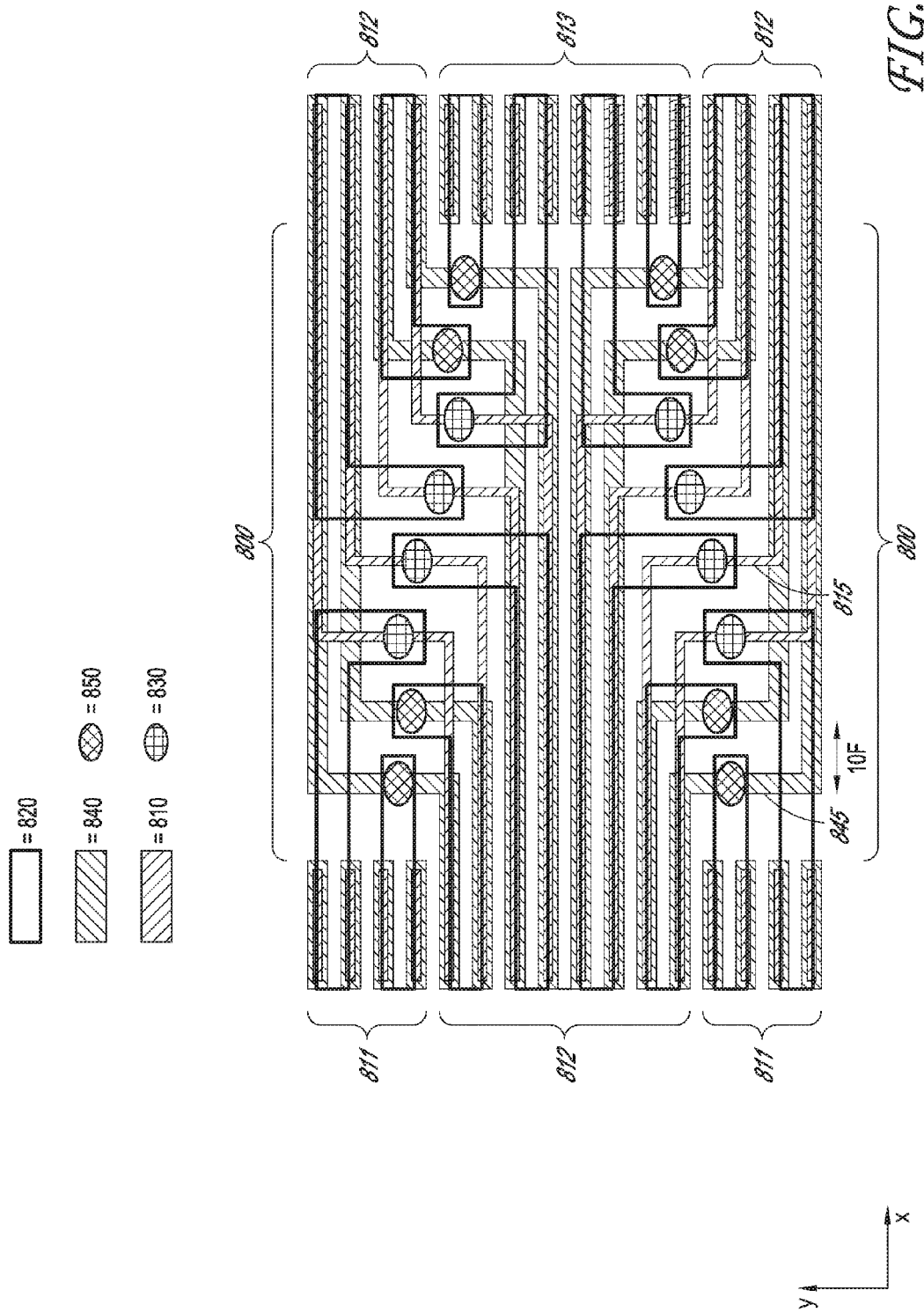
FIG. 8 is an illustration depicting an example configuration of electrode lines of two different memory decks coupled to a metallization layer in a socket interconnect region for an example implementation of a memory array.

FIG. 8 illustrates how sockets structures described herein can be extended to multi-level memory arrays. In particular, FIG. 8 illustrates a socket interconnect region 800 for a multi-deck memory array, including word lines 810 of an upper deck, word lines 840 of a lower deck and interconnect lines 820 of a metal level or "glue" layer. The word lines 810 and 840 of both decks can have a fine pitch (e.g., "F") for a dense memory array, whereas the interconnect lines 820 of the glue layer can have a much courser pitch (e.g., 2F or greater). As illustrated, the word lines 810 of the upper deck overlap with the word lines 840 of the lower deck except within the socket region 800. In the socket region, the word lines 810 of the upper deck partially overlap horizontal positions of the word lines 840 of the lower deck. In contrast, the horizontal positions of horizontal jogs 815 and 845 do not overlap such that vertical connectors 830 and 850 make independent connections to the metal level. In particular, the horizontal jogs 815 and 845 are formed at different locations for the upper and lower word lines 810 and 840, allowing lateral separation (e.g., 4F or greater, and illustrated as 10F) sufficient to permit independent vertical connections to the interconnect lines 820, which can be formed below the array. The separation enabled by the jogs 815 and 845 allows contact formation to pitch multiplied lines 810 and 840 using conventional mask technology, e.g., well within the limits of photolithographic resolution, to form the vertical connections. FIG. 8 also illustrates vertical connectors positioned within the socket region 800. In particular, the vertical connectors 850 connect horizontal jogs 845 of the word lines 840 of the lower deck to interconnect lines 820. FIG. 8 further illustrates vertical connectors 830 independently connecting horizontal jogs 815 of the word lines 810 of the upper deck to the interconnect lines 820. In the illustrated embodiment, the vertical connectors join each of the word lines 810 and 840 at a central location along the electrode line. Similarly, socket regions can be further widened to permit vertical interconnection for greater numbers electrode levels for multiple deck memory arrays.

As in the example of FIGS. 4-6B, bundles 812 (eight shown) of electrode lines can pass through the socket region 800, while other bundles 811 and 813 can terminate at the socket region 800. In this example, the identified bundles are formed for the upper deck and the lower deck electrodes, overlapping and thus occupying the same real estate except where they are separated at the socket region 800 for contact. While the illustrated example is discussed in terms of word lines, the skilled artisan will appreciate that the socket scheme is equally applicable to digit lines of multi-deck memory arrays.

As previously mentioned, embodiments in accordance with claimed subject matter may be applied both to word lines and to digit lines of a PCMS cross-point array, each cell of which can include both a PCM storage element and a chalcogenide switch. Also, embodiments may be extended to any numbers of decks. Additionally, although examples described herein describe PCMS memory arrays, embodiments in accordance with claimed subject matter may be applied to other types of cross-point memory array types, including RRAM and CBRAM, to name a couple of examples.

As described above, quilt architecture implementations of cross-point memory arrays may utilize pitch multiplication techniques, such as SADP, to form and terminate word lines and/or digit lines in a manner that allows for efficient connection of the word lines and/or digit lines to underlying metal layers, such as a glue layer. Embodiments described herein reduce the amount of area required to connect the word lines and/or digit lines to vias that in turn provide electrical connections to driver circuitry positioned beneath the memory array, for example.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

In the preceding detailed description, numerous specific details have been set forth to provide a thorough understanding of claimed subject matter. However, it will be understood by those skilled in the art that claimed subject matter may be practiced without these specific details. In other instances, methods or apparatuses that would be known by one of ordinary skill have not been described in detail so as not to obscure claimed subject matter.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein.

Therefore, it is intended that claimed subject flatter not be limited to the particular examples disclosed, but that such claimed subject matter may also include all aspects falling within the scope of appended claims, and equivalents thereof.

What is claimed is:

1. A system comprising:
a plurality of memory cells having stored therein one or more data states;
a plurality of memory electrode lines extending parallel to one another along a first direction, wherein each memory electrode line is electrically coupled to at least one of the memory cells;
a first subset of the memory electrode lines that terminate at different positions along the first direction;
a second subset of the memory electrode lines that extend through a socket region without terminating, wherein each memory electrode line of the second subset of the memory electrode lines forms a jog segment within the socket region, each jog segment deviating from parallel to the first direction; and
a plurality of vertical connectors each contacting one of the second subset of memory electrode lines at a jog segment.

2. The system of claim 1, wherein each memory electrode line of the second subset has an electrode length in the first direction, wherein the jog segment is located at a substantially central location along the electrode length.

3. The system of claim 2, further comprising one or more memory electrode line drivers positioned in a semiconductor material and arranged in an at least partially repeating pattern of alternating memory electrode line drivers, wherein each memory electrode line driver is electrically coupled to a memory electrode line of the second subset at a jog segment.

4. The system of claim 1, wherein the first subset of the memory electrode lines and the second subset of memory electrode lines form a bundle of at least four memory electrode lines.

5. The system of claim 1, wherein each jog segment of a first group of the second subset of the memory electrode lines deviates from the first direction toward a first side, and wherein each jog segment of a second group of the second subset of the memory electrode lines deviates from the first direction toward a second side different from the first side.

6. The system of claim 5, wherein the second side is opposite the first side.

7. The system of claim 1, wherein a shortest distance from an edge of one jog segment to a corresponding edge of an immediately adjacent jog segment in the first direction is at least four times a minimum feature size F of a memory electrode line.

8. The system of claim 1, wherein the plurality of memory electrode lines comprise:
memory word lines, or memory digit lines, or a memory word line and a memory digit line.

9. A system comprising:
a plurality of memory electrode lines positioned along a first direction, wherein at least one memory electrode line is electrically coupled to a memory cell;
a first subset of the memory electrode lines extending through a socket region and each forming a jog segment within the socket region; and
a plurality of vertical connectors each contacting the jog segment of one of the first subset of memory electrode lines.

10. The system of claim 9, further comprising:
a second subset of the memory electrode lines, wherein each of the second subset of the memory electrode lines contacts one of the vertical connectors and terminates in the socket region after contacting one of the vertical connectors.

11. The system of claim 9, wherein a lateral dimension of at least one of the plurality of vertical connectors is greater than a minimum feature size F of at least one of the plurality of memory electrode lines.

12. The system of claim 9, wherein a lateral dimension of at least one of the plurality of vertical connectors is at least twice a minimum feature size F of the first subset of the memory electrode lines.

13. The system of claim 9, wherein a length of the jog segment is at least twice a minimum feature size F of a memory electrode line in the first subset of the memory electrode lines.

14. The system of claim 13, wherein at least two jog segments are a same length.

15. The system of claim 9, wherein at least one jog segment is perpendicular to the first direction.

16. The system of claim 9, wherein a first jog segment is parallel to a second jog segment.

17. A method comprising:
forming a plurality of conductive lines below a plurality of electrode lines; and
electrically connecting the plurality of conductive lines to the plurality of electrode lines using a vertical connector disposed between each of the plurality of conductive lines and each of the plurality of electrode lines.

18. The method of claim 17, wherein forming the plurality of conductive lines comprises:
forming the plurality of conductive lines in a metal interconnect layer.

19. The method of claim 17, wherein forming the plurality of conductive lines comprises:
forming a hard mask in a pattern within a plurality of memory cells that creates the plurality of conductive lines extending along a first direction and terminating at different positions along the first direction.

20. The method of claim 17, wherein forming the hard mask comprises:
forming a mask having a lithographic resolution coarser than a minimum feature size F of a memory array.

\* \* \* \* \*